(12) United States Patent
Yoshida et al.

(10) Patent No.: US 10,803,955 B2
(45) Date of Patent: Oct. 13, 2020

(54) SEMICONDUCTOR MEMORY DEVICE

(71) Applicant: Toshiba Memory Corporation, Minato-ku (JP)

(72) Inventors: Masashi Yoshida, Yokohama (JP); Naofumi Abiko, Kawasaki (JP); Yoshikazu Harada, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/293,698

(22) Filed: Mar. 6, 2019

(65) Prior Publication Data
US 2020/0013468 A1 Jan. 9, 2020

(30) Foreign Application Priority Data

Jul. 3, 2018 (JP) .................. 2018-126865

(51) Int. Cl.
*G11C 16/10* (2006.01)
*G11C 16/04* (2006.01)
*G11C 16/34* (2006.01)
*H01L 27/1157* (2017.01)
*G11C 11/56* (2006.01)
*H01L 27/11524* (2017.01)

(52) U.S. Cl.
CPC .......... *G11C 16/10* (2013.01); *G11C 16/0483* (2013.01); *G11C 16/3459* (2013.01); *G11C 11/5628* (2013.01); *G11C 11/5671* (2013.01); *G11C 16/0475* (2013.01); *H01L 27/1157* (2013.01); *H01L 27/11524* (2013.01)

(58) Field of Classification Search
CPC .. G11C 16/10; G11C 16/0475; G11C 16/0483
USPC .......................... 365/185.28, 185.33, 185.22
See application file for complete search history.

(56) References Cited

U.S. PATENT DOCUMENTS

| 6,353,555 B1 * | 3/2002 | Jeong | G11C 16/08 365/185.11 |
| 6,522,583 B2 * | 2/2003 | Kanda | G11C 16/10 365/185.17 |
| 6,661,707 B2 * | 12/2003 | Choi | G11C 16/12 365/185.17 |

(Continued)

FOREIGN PATENT DOCUMENTS

JP 2012-123856 6/2012
JP 5330425 B2 10/2013

Primary Examiner — Son L Mai
(74) Attorney, Agent, or Firm — Oblon, McClelland, Maier & Neustadt, L.L.P.

(57) ABSTRACT

According to one embodiment, a semiconductor memory device includes: a memory cell array; a plurality of bit lines respectively connected to memory cells; a word line commonly connected to the memory cells; and a control circuit. The control circuit programs a first memory cell of a first state and a second memory cell of a second state by using a first program pulse. The control circuit applies a first voltage to a first bit line connected to the first memory cell, and applies a second voltage lower than the first voltage to a second bit line connected to the second memory cell at a first time within a first period during which the first program pulse is applied. The control circuit applies the second voltage to the first and second bit lines at a second time within the first period.

16 Claims, 16 Drawing Sheets

(56) References Cited

U.S. PATENT DOCUMENTS

| | | | |
|---|---|---|---|
| 7,184,308 B2 * | 2/2007 | Kwon | G11C 8/08 |
| | | | 365/185.17 |
| 7,596,026 B2 * | 9/2009 | Kwon | G11C 16/0483 |
| | | | 365/185.14 |
| 8,320,187 B2 | 11/2012 | Nagao | |
| 8,422,306 B2 | 4/2013 | Matsunami | |
| 9,842,657 B1 | 12/2017 | Dutta et al. | |
| 2005/0117399 A1 | 6/2005 | Kwon et al. | |

* cited by examiner

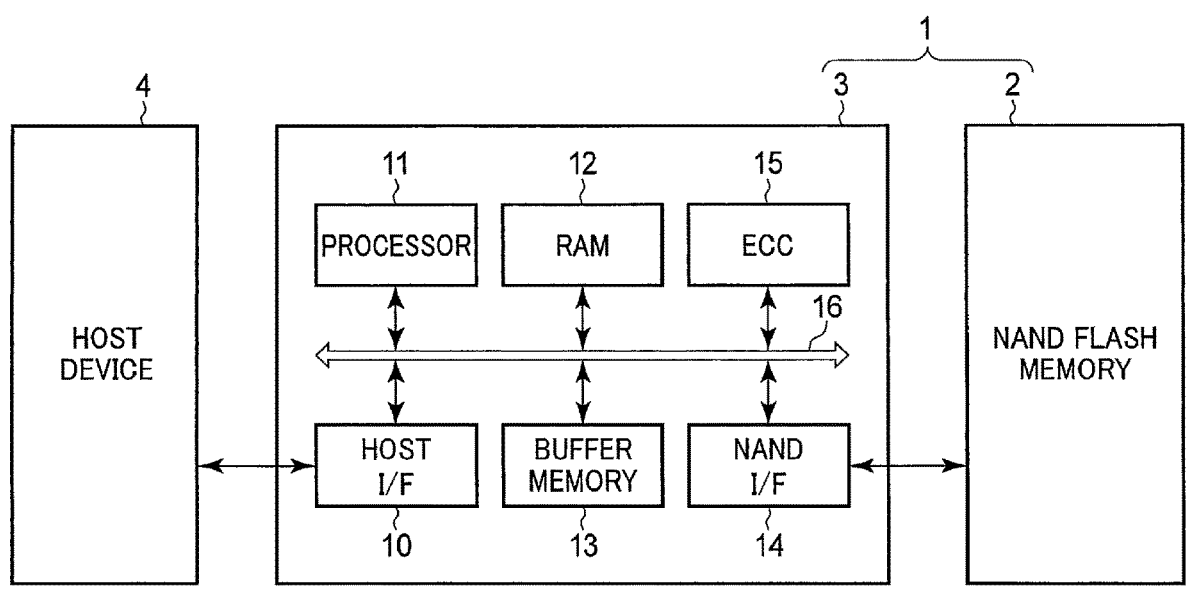
F I G. 1

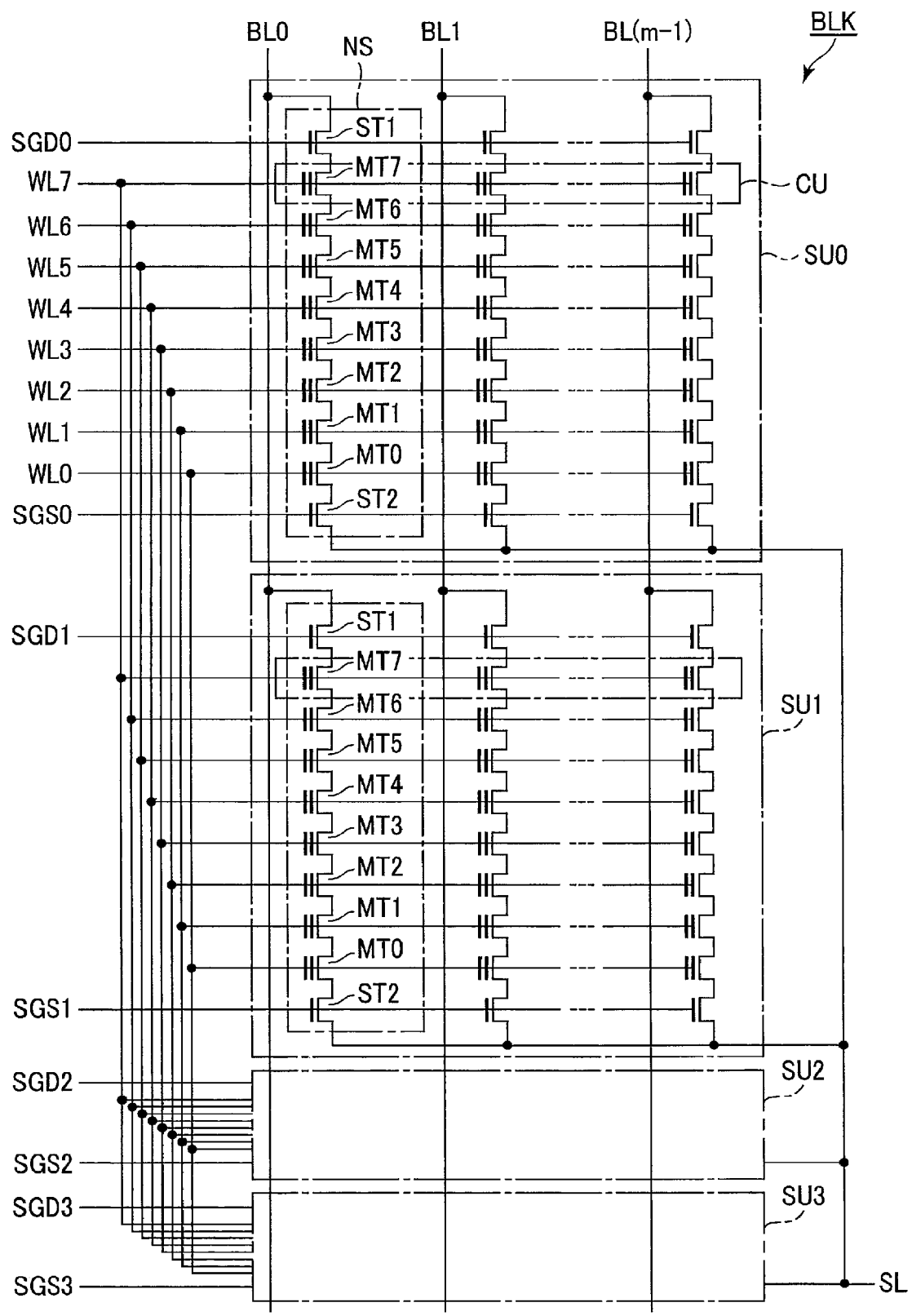
F I G. 3

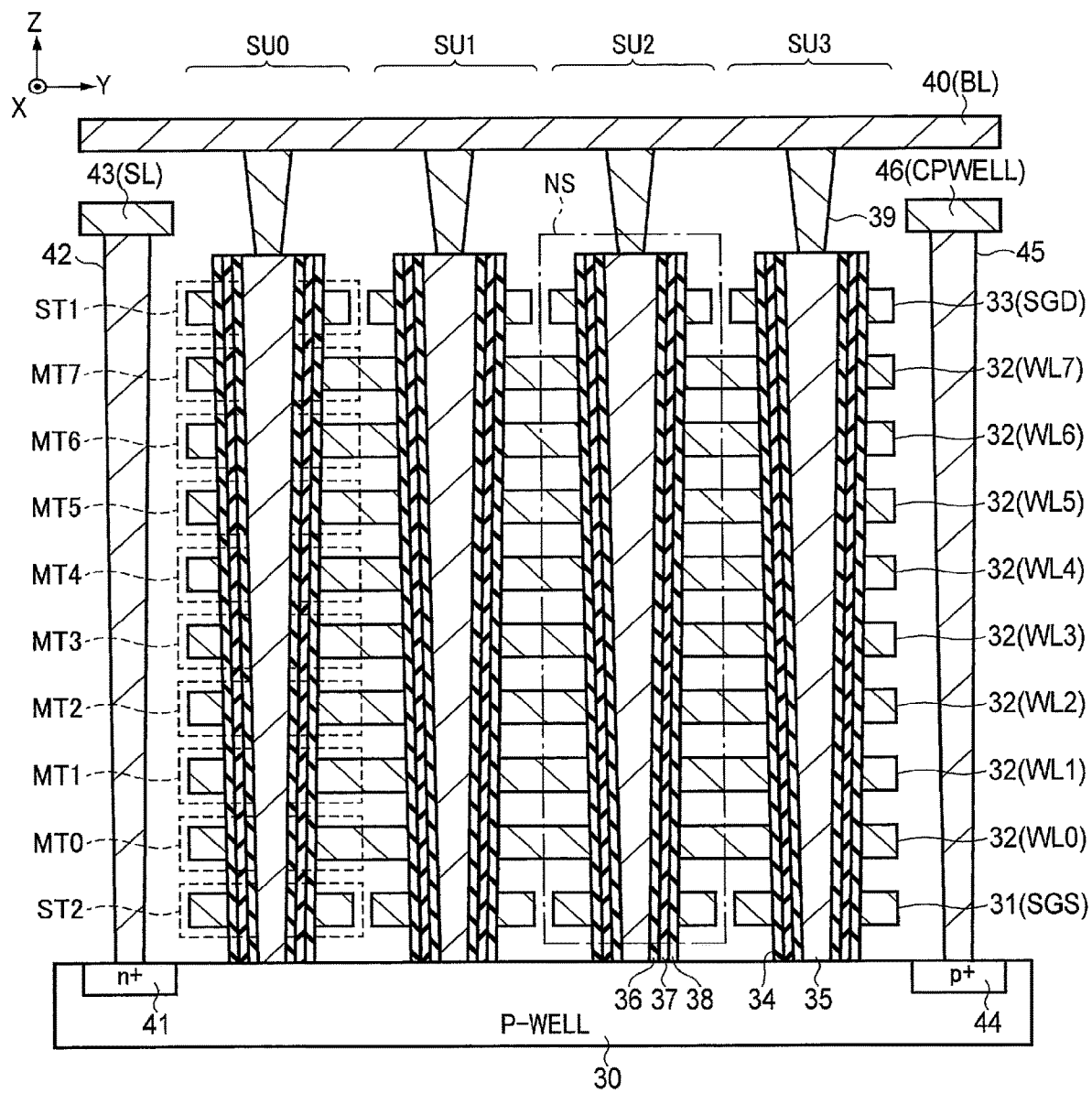
F I G. 4

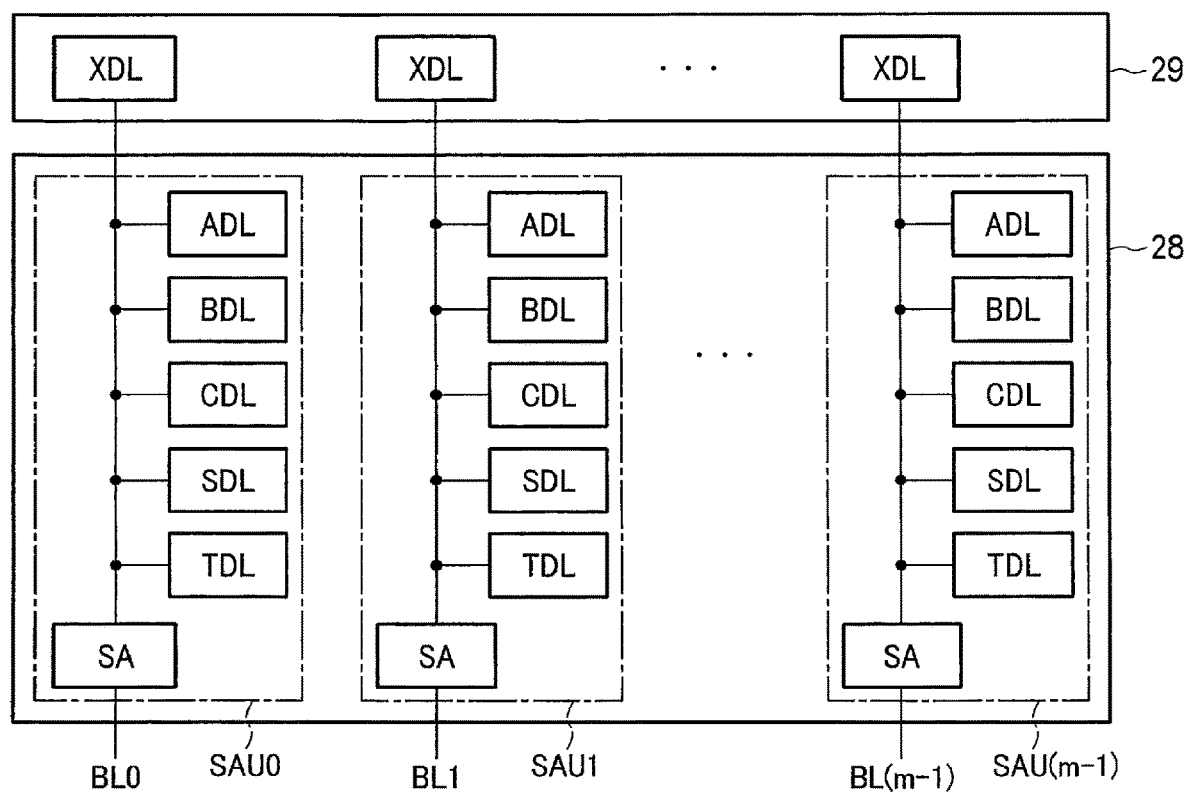
F I G. 6

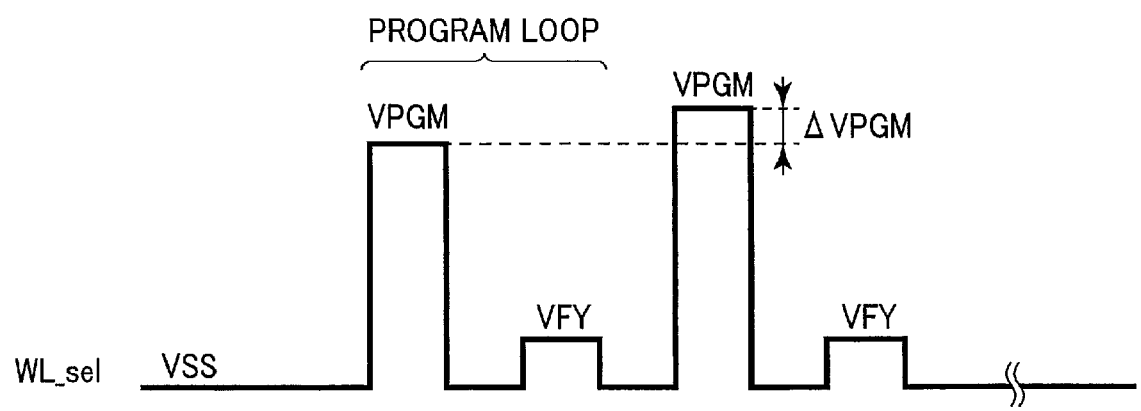
F I G. 8

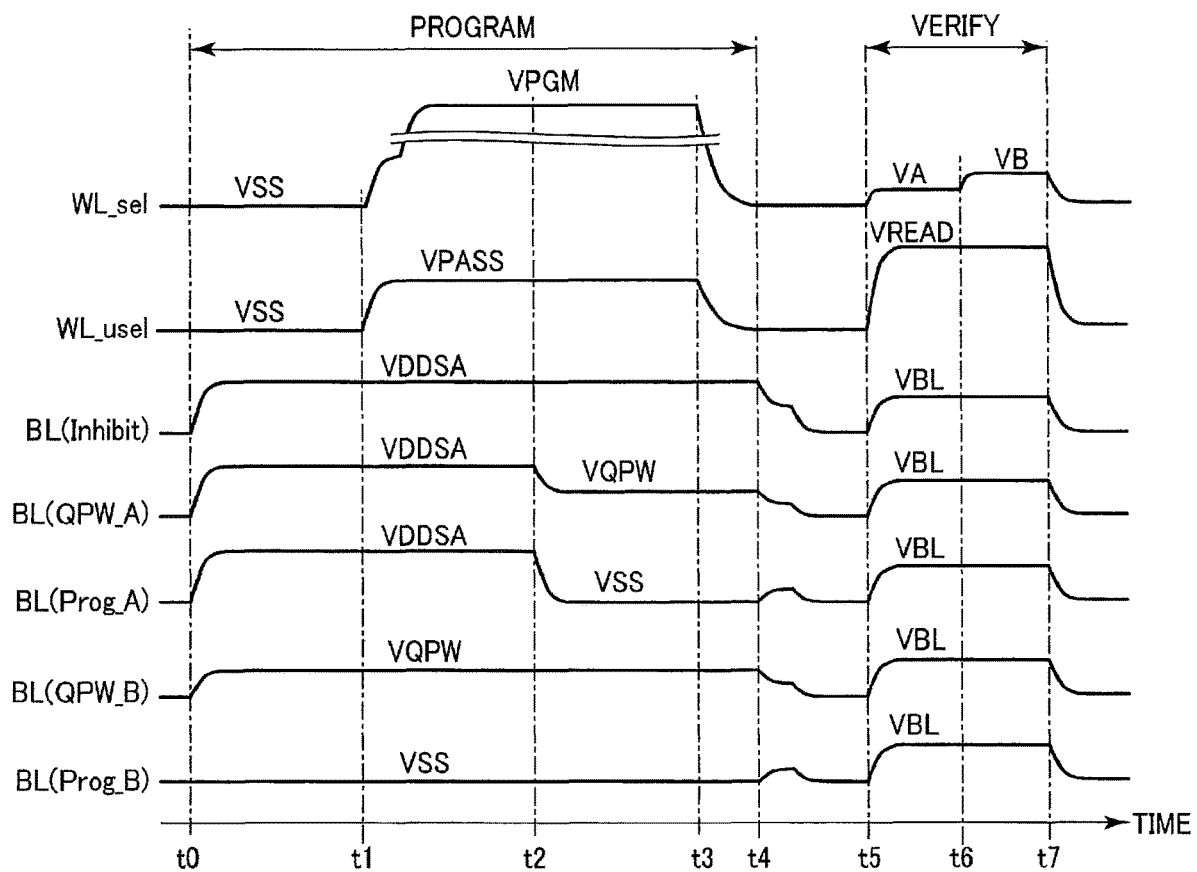
F I G. 11

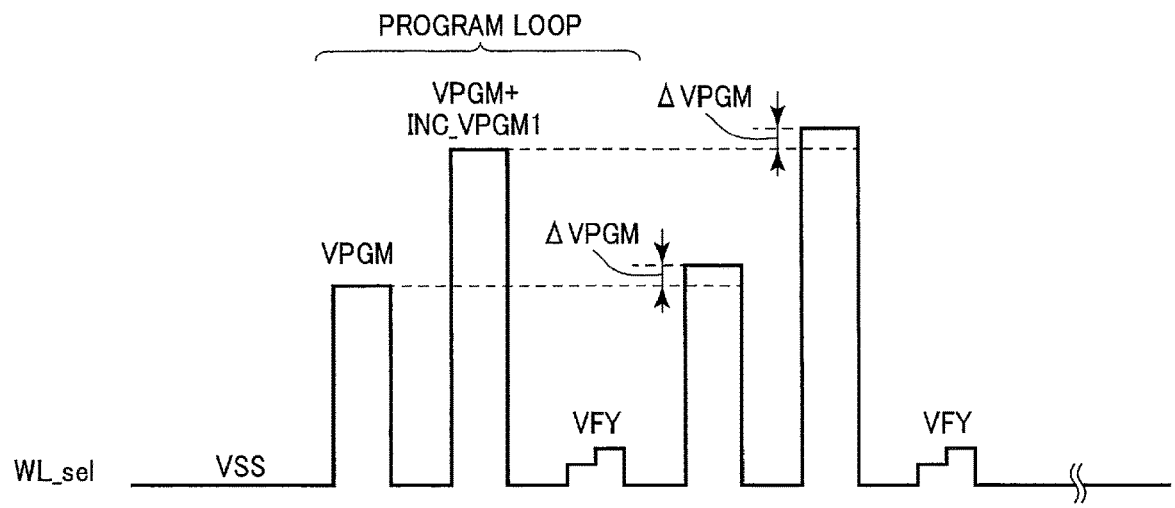
F I G. 15
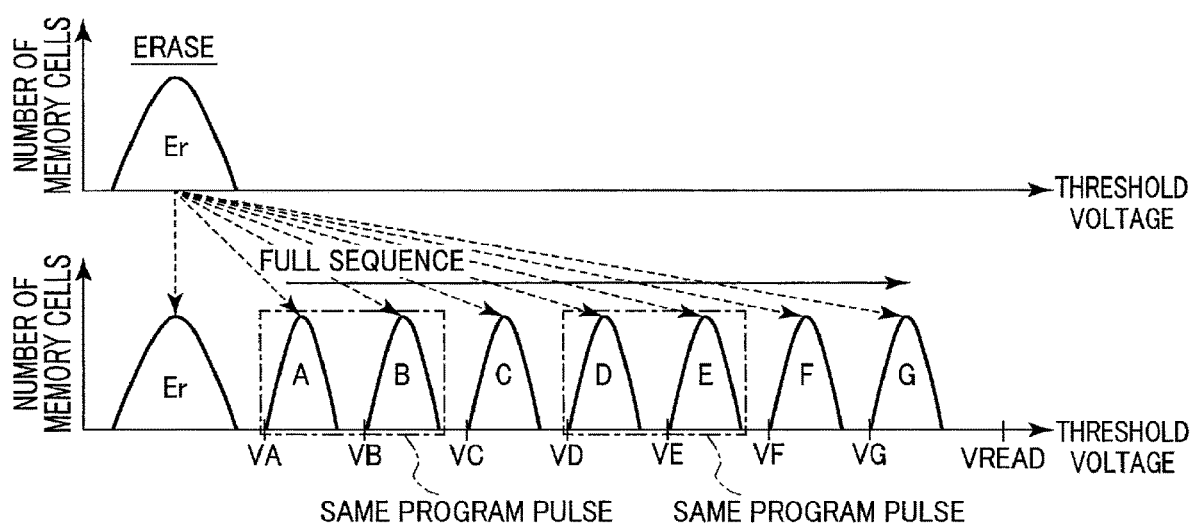
F I G. 16

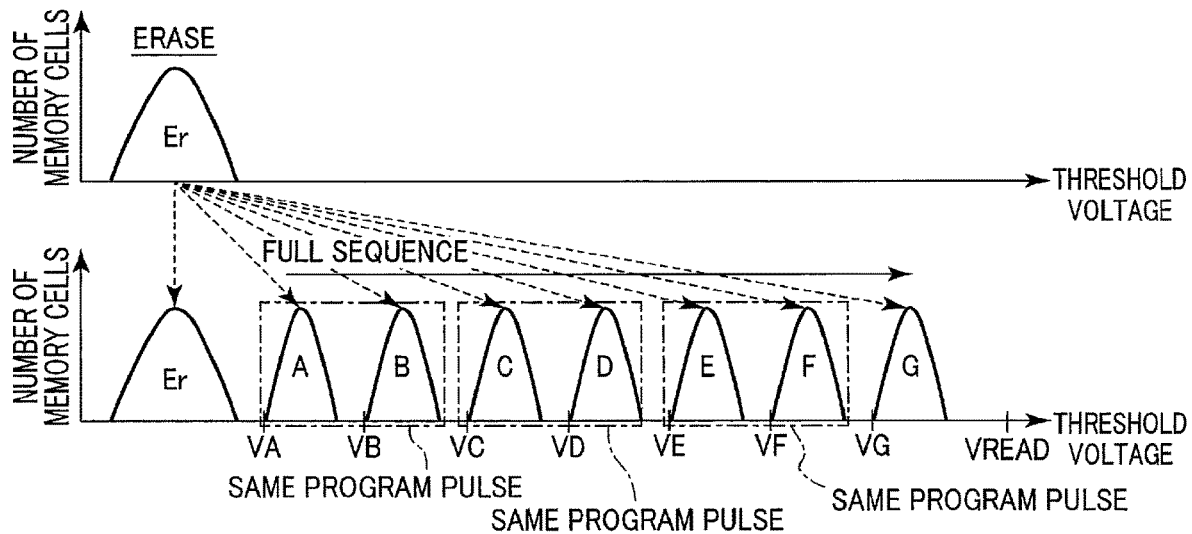
F I G. 17
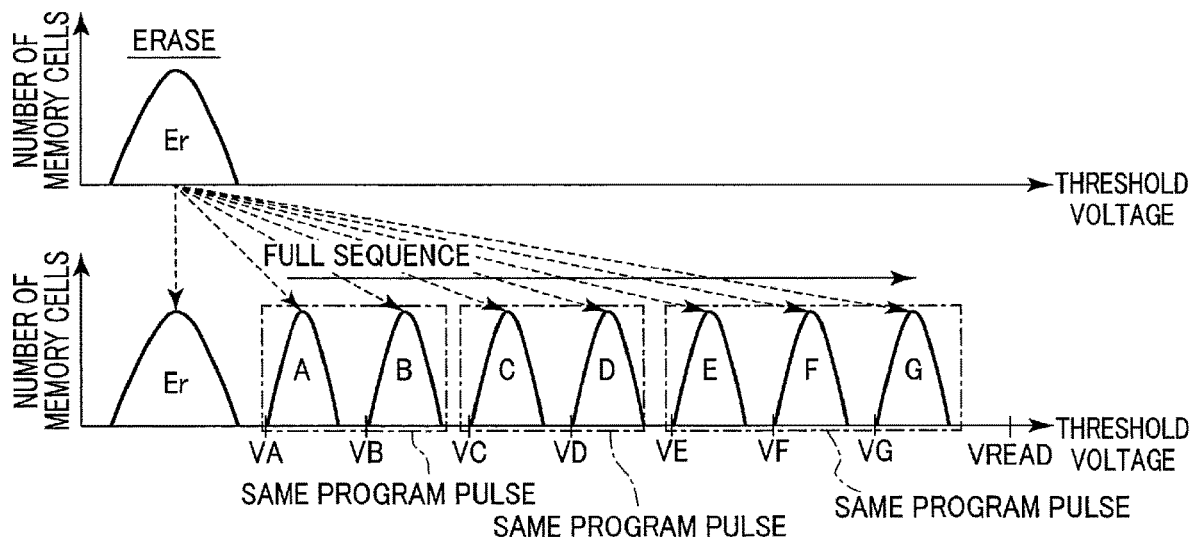
F I G. 18

SEMICONDUCTOR MEMORY DEVICE

CROSS-REFERENCE TO RELATED APPLICATIONS

This application is based upon and claims the benefit of priority from Japanese Patent Application No. 2018-126865, filed Jul. 3, 2018, the entire contents of which are incorporated herein by reference.

FIELD

Embodiments of the present invention generally relate to a semiconductor memory device.

BACKGROUND

As one type of semiconductor memory device, a NAND flash memory is known in the art. Also, a NAND flash memory wherein memory cells are arranged three-dimensionally is known in the art.

BRIEF DESCRIPTION OF THE DRAWINGS

FIG. 1 is a block diagram illustrating a memory system according to a first embodiment;

FIG. 3 is a circuit diagram of a block BLK;

FIG. 4 is a sectional view of a partial region of the block BLK;

FIG. 6 is a block diagram of a sense amplifier unit and a data register shown in FIG. 2;

FIG. 8 is a schematic diagram illustrating a program sequence;

FIG. 11 is a timing chart illustrating the program operation according to the first embodiment;

FIG. 15 is a diagram illustrating a program sequence according to the second embodiment;

FIG. 16 is a diagram illustrating a program operation according to a modification of the second embodiment;

FIG. 17 is a diagram illustrating a program operation according to a third embodiment;

FIG. 18 is a diagram illustrating a program operation according to a fourth embodiment.

DETAILED DESCRIPTION

Figure 2:
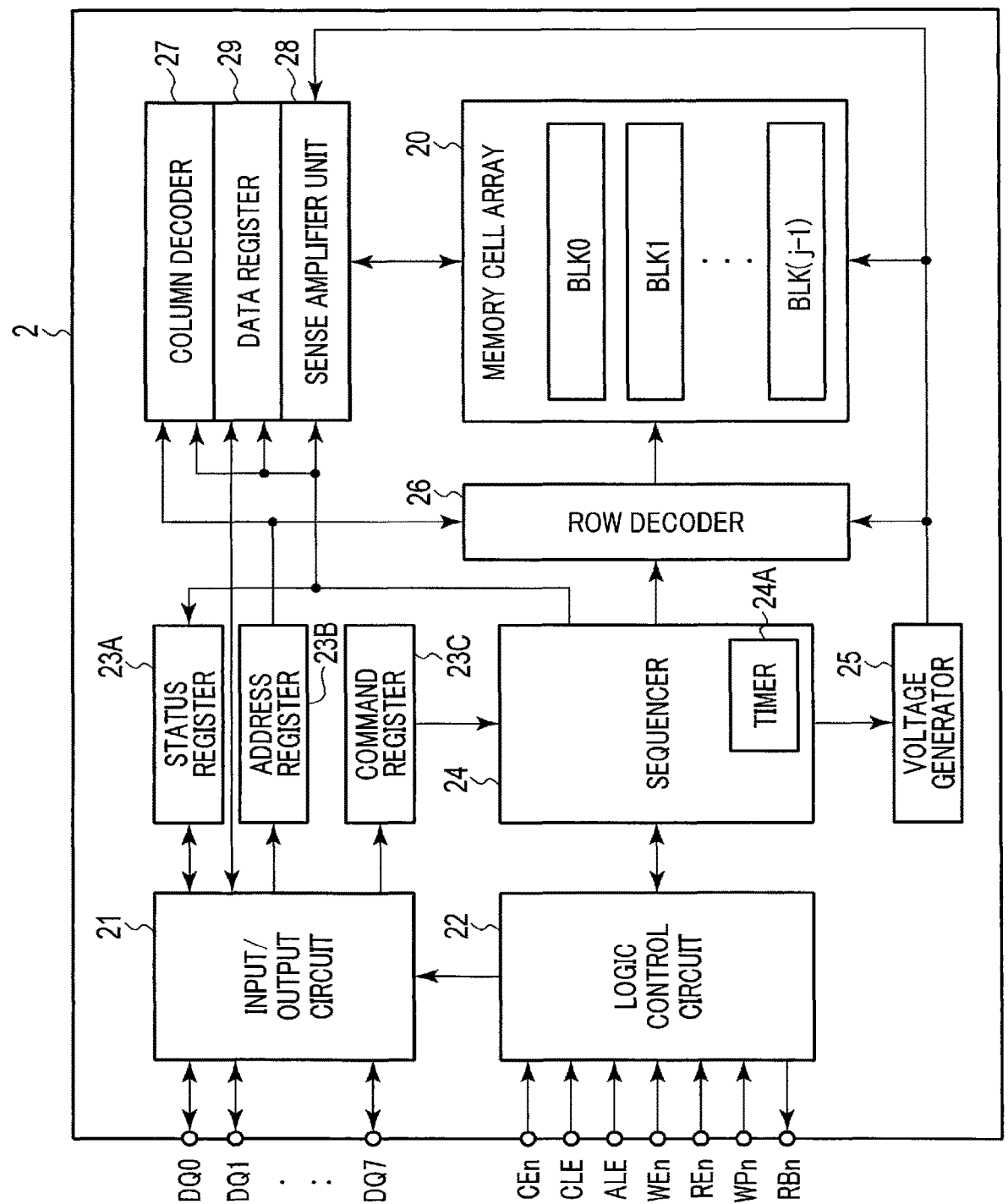
FIG. 2 is a block diagram of a NAND flash memory shown in FIG. 1.

In general, according to one embodiment, there is provided a semiconductor memory device comprising:

a memory cell array comprising a plurality of memory cells, each of the memory cells being programmable to any one of a plurality of states;

a plurality of bit lines respectively connected to the memory cells;

a word line commonly connected to the memory cells; and a control circuit which applies a program pulse to the word line and programs data in the memory cells, wherein the control circuit programs a first memory cell of a first state and a second memory cell of a second state higher than the first state by using a first program pulse, applies a first voltage to a first bit line connected to the first memory cell, and applies a second voltage lower than the first voltage to a second bit line connected to the second memory cell at a first time within a first period during which the first program pulse is applied, and applies the second voltage to the first and second bit lines at a second time within the first period and after the first time.

Hereinafter, embodiments will be described with reference to the drawings. Several embodiments described below merely show exemplary apparatuses and methods that implement the technical ideas of the present invention. The technical ideas are not limited by the element shapes, structures, arrangements etc. described below. Each of the function blocks can be implemented in the form of hardware, software or a combination of them. The function blocks need not be such blocks as will be described below. For example, part of the functions of one exemplary function block may be implemented by another function block. In addition, an exemplary function block may be divided into more specific function blocks. In the description below, structural elements having substantially the same functions and configurations will be denoted by the same reference symbols, and a repetitive description of such elements will be given only where necessary.

[1] First Embodiment

[1-1] Configuration of Memory System 1

FIG. 1 is a block diagram illustrating a memory system 1 according to a first embodiment. The memory system 1 comprises a NAND flash memory (semiconductor memory device) 2 and a memory controller 3.

The memory system 1 may be configured by providing a plurality of chips (which constitute the memory system 1) on a motherboard on which a host device is provided; alternatively, the memory system 1 may be configured as such a one-module element as a system LSI (large-scale integrated circuit) or an SoC (system on chip). Examples of the memory system 1 include a memory card such as a SD (trademark) card, an SSD (solid state drive) and an eMMC (embedded multimedia card).

The NAND flash memory 2 includes a plurality of memory cell transistors and nonvolatilely stores data. A specific configuration of the NAND flash memory 2 will be described later.

In response to an instruction supplied from a host device 4, the memory controller 3 instructs the NAND flash memory 2 to perform a write operation (referred to as a program operation as well), a read operation, an erase operation and the like. The memory controller 3 manages the memory space of the NAND flash memory 2. The memory controller 3 includes a host interface circuit (host I/F) 10, a processor 11, a RAM (random access memory) 12, a buffer memory 13, a NAND interface circuit (NAND I/F) 14, an ECC (error checking and correcting) circuit 15, etc. These modules are connected to each other via a bus 16.

The host interface circuit 10 is connected to the host device 4 through a host bus and performs interface processing for the host device 4. The host interface circuit 10 exchanges instructions, addresses and data with reference to the host device 4.

The processor 11 is made of a CPU (central processing unit), for example. The processor 11 controls the entire operation of the memory controller 3. For example, when a write instruction is received from the host device 4, the processor 11 issues a write instruction based on the NAND interface to the NAND flash memory 2 in response to the received instruction. Similar operations are performed in read and erase operations as well. The processor 11 also executes various kinds of processes such as wear leveling and garbage collection to manage the NAND flash memory 2.

The RAM 12 is used as a work space of the processor 11 and stores firmware loaded from the NAND flash memory 2, various tables generated by the processor 11, etc. The RAM 12 is, for example, a DRAM and/or an SRAM. The buffer memory 13 temporarily holds data transmitted from the host device 4 and temporarily holds data transmitted from the NAND flash memory 2. The buffer memory 13 may be included in the RAM 12.

During a write operation, the ECC circuit 15 generates an error correcting code for write data, adds the error correcting code to the write data, and transmits the resultant write data to the NAND interface circuit 14. During a read operation, the ECC circuit 15 performs error detection and error correction for read data, using the error correcting code included in the read data. The ECC circuit 15 may be incorporated in the NAND interface circuit 14.

The NAND interface circuit 14 is connected to the NAND flash memory 2 through a NAND bus and performs interface processing for the NAND flash memory 2. The NAND interface circuit 14 exchanges instructions, addresses and data with reference to the NAND flash memory 2.

[1-1-1] Configuration of NAND Flash Memory 2

FIG. 2 is a block diagram of the NAND flash memory 2 shown in FIG. 1.

The NAND flash memory 2 includes a memory cell array 20, an input/output circuit 21, a logic control circuit 22, a register group (including a status register 23A, an address register 23B, and a command register 23C), a sequencer (control circuit) 24, a voltage generator 25, a row decoder 26, a column decoder 27, a sense amplifier unit 28, and a data register (data cache) 29.

The memory cell array 20 includes j blocks BLK0 to BLK(j−1). j is an integer of 1 or more. Each of the blocks BLK includes a plurality of memory cell transistors. The memory cell transistors are made of electrically rewritable memory cells. A plurality of bit lines, a plurality of word lines and a source line are arranged in the memory cell array 20 so as to control the voltages applied to the respective memory cell transistors. A specific configuration of the blocks BLK will be described later.

The input/output circuit 21 and the logic control circuit 22 are connected to the memory controller 3 through a NAND bus. The input/output circuit 21 exchanges signals DQ (e.g., DQ0 to DQ7) with reference to the memory controller 3 through the NAND bus.

The logic control circuit 22 receives external control signals (e.g., chip enable signal CEn, command latch enable signal CLE, address latch enable signal ALE, write enable signal WEn, read enable signal REn, and write protect signal WPn) from the memory controller 3 through the NAND bus. "n" added to the name of each signal indicates active low. The logic control circuit 22 transmits a ready/busy signal RBn to the memory controller 3 through the NAND bus.

The signal CEn enables selection of the NAND flash memory 2 and is asserted when selecting the NAND flash memory 2. The signal CLE enables a command transmitted as the signal DQ to be latched in the command register. The signal ALE enables an address transmitted as the signal DQ to be latched in the address register. The signal WEn enables data to be input to the NAND flash memory 2 via a DQ line. The signal REn enables data to be output from the NAND flash memory 2 via the DQ line. The signal WPn is asserted when a write operation and an erase operation are inhibited. The signal RBn indicates whether the NAND flash memory 2 is in the ready state (i.e., a state in which an external instruction can be accepted) or a busy state (i.e., a state in which an external instruction cannot be accepted). The memory controller 3 can be informed of the state of the NAND flash memory 2 by receiving the signal RBn from the NAND flash memory 2.

The status register 23A temporarily holds data required for the NAND flash memory 2 to operate. The address register 23B temporarily holds an address. The command register 23C temporarily holds a command. The status register 23A, the address register 23B, and the command register 23C are made of an SRAM, for example.

The control circuit 24 receives a command from the command register 23C and comprehensively controls the NAND flash memory 2 in accordance with a sequence based on this command. The control circuit 24 includes a timer 24A which counts a time or clock. The control circuit 24 can perform timing control using a count value of the timer 24A.

The voltage generator 25 receives a power supply voltage externally of the NAND flash memory 2 and generates a plurality of voltages for the write operation, read operation and erase operation, using the power supply voltage. The voltage generator 25 supplies the generated voltages to the memory cell array 20, the row decoder 26, the sense amplifier unit 28, etc.

The row decoder 26 receives a row address from the address register 23B and decodes this row address. The row decoder 26 performs a selection operation for word lines and the like, based on the decoded row address. The row decoder 26 transfers the voltages required for the write operation, read operation and erase operation to the memory cell array 20.

The column decoder 27 receives a column address from the address register 23B and decodes this column address. The column decoder 27 performs a selection operation for bit lines, based on the decoded column address.

During the read operation, the sense amplifier unit 28 senses and amplifies data that is read from a memory cell transistor to a bit line. During the write operation, the sense amplifier unit 28 transfers write data to a bit line.

During the read operation, the data register 29 temporarily holds data transferred from the sense amplifier unit 28, and serially (e.g., every 8 bits) forwards the data to the input/output circuit 21. During the write operation, the data register 29 temporarily holds data serially transferred from the input/output circuit 21, and forwards the data to the sense amplifier unit 28 in parallel. The data register 29 is made of an SRAM, for example.

[1-1-2] Configuration of Block BLK

FIG. 3 is a circuit diagram of the block BLK. Each of the blocks BLK includes a plurality of string units SU. In FIG.

3, four string units SU0 to SU3 are shown by way of example. The number of string units SU included in the block BLK can be optionally determined.

Each of the string units SU includes a plurality of NAND strings (memory strings) NS. The number of NAND strings NS included in the string unit SU can be optionally determined.

Each of the NAND strings NS includes a plurality of memory cell transistors MT and two select transistors ST1 and ST2. The memory cell transistors MT are connected in series between the source of the select transistor ST1 and the drain of the select transistor ST2. In the present specification, the memory cell transistors may be referred to as memory cells or cells. FIG. 3 shows, for simplicity, a configuration example in which the NAND string NS includes eight memory cell transistors MT (MT0 to MT7), but the number of memory cell transistors MT provided in the NAND string NS is actually more than eight and can be optionally determined. The memory cell transistor MT includes a control gate electrode and a charge storage layer and nonvolatilely stores data. Each of the memory cell transistors MT can hold data of a bit or data of two or more bits.

The gates of the select transistors ST1 of the string unit SU0 are commonly connected to a select gate line SGD0. Likewise, the gates of the select transistors ST1 of string units SU1 to SU3 are connected to select gate lines SGD1 to SGD3, respectively. The gates of the select transistors ST2 of the string unit SU0 are commonly connected to a select gate line SGS0. Likewise, the gates of the select transistors ST2 of the string units SU1 to SU3 are connected to select gate lines SGS1 to SGS3, respectively. A common select gate line SGS may be connected to the string units SU0 to SU3 included in each of the blocks BLK. The control gates of the memory cell transistors MT0 to MT7 in each of the blocks BLK are connected to word lines WL0 to WL7, respectively.

Of the NAND strings NS arranged in the matrix pattern in each of the blocks BLK, the drains of the select transistors ST1 of the NAND strings NS of the same column are commonly connected to any one of bit lines BL0 to BL(m−1). "m" is an integer of 1 or more. Each of the bit lines BL is commonly connected to the blocks BLK, and is connected to the NAND string NS in each of the string units SU included in each of the blocks BLK. The sources of the select transistors ST2 included in each of the blocks BLK are commonly connected to a source line SL. The source line SL is commonly connected to, for example, the blocks BLK.

The data in the memory cell transistors MT in each of the blocks BLK can be erased in a collective manner, for example. The read operation and the write operation are collectively performed for the memory cell transistors MT commonly connected to the word line WL of the string unit SU. A set of the memory cell transistors MT that share the same word line WL in the string unit SU is referred to as a cell unit CU. The 1-bit data stored in the memory cell transistors MT included in the cell unit CU is referred to as a page. In other words, the write operation and the read operation for the cell unit CU are executed in units of pages.

The NAND string NS may be provided with dummy cell transistors. To be specific, for example, two dummy cell transistors (not illustrated) are connected in series between the select transistor ST2 and the memory cell transistor MT0. For example, two dummy cell transistors (not shown) are connected in series between the memory cell transistor MT7 and the select transistor ST1. Dummy word lines are connected to the gates of the dummy cell transistors. The configurations of the dummy cell transistors are similar to those of the memory cell transistors. The dummy cell transistors are not for storing data and have a function of relieving the disturbance which the memory cell transistors and select transistors may undergo during the write operation and erase operation.

[1-1-3] Stacked Configuration of Block BLK

Next, an example of a stacked configuration of the block BLK will be described. FIG. 4 is a sectional view of a partial region of the block BLK. In FIG. 4, the X direction is a direction in which the select gate lines extend, the Y direction orthogonal to the X direction in a horizontal plane is a direction in which the bit lines extend, and the Z direction is a stacking direction.

A p-type well region (p-well) 30 is provided in a semiconductor layer or a semiconductor substrate. The NAND strings NS are provided on the p-type well region 30. That is, a wiring layer 31 functioning as the select gate line SGS, eight wiring layers 32 functioning as the word lines WL0 to WL7, and a wiring layer 33 functioning as the select gate line SGD are stacked on the well region 30 in this order with a plurality of insulating layers interposed therein. Hatching of the insulating layers provided between the stacked wiring layers is omitted to avoid the drawing from looking too complex.

A memory hole 34 penetrates the wiring layers 31, 32 and 33 and reaches the well region 30. A pillar-shaped semiconductor layer (semiconductor pillar) 35 is provided inside the memory hole 34. A gate insulating film 36, a charge storage layer (an insulating film) 37, and a block insulating film 38 are stacked on the side wall of the semiconductor pillar 35 in the order mentioned. By these elements, the memory cell transistors MT and the select transistors ST1 and ST2 are formed. The semiconductor pillar 35 functions as a current path of the NAND string NS and is a region in which the channels of the transistors are formed. The upper end of the semiconductor pillar 35 is connected via a contact plug 39 to a metal wiring layer 40 functioning as the bit line BL.

An $n^+$-type diffusion region 41 doped with n type impurities at high concentration is provided in the surface region of the well region 30. A contact plug 42 is provided on the diffusion region 41. The contact plug 42 is connected to a metal wiring layer 43 functioning as the source line SL. In addition, a $p^+$-type diffusion region 44 doped with p type impurities at high concentration is provided in the surface region of the well region 30. A contact plug 45 is provided on the diffusion region 44. The contact plug 45 is connected to a metal wiring layer 46 functioning as a well interconnect CPWELL. The well interconnect CPWELL is an interconnect used to apply a voltage to the semiconductor pillar 35 via the well region 30.

The configurations described above are arranged in the depth direction of the drawing sheet of FIG. 4 (the X direction). The string unit SU is formed by a group of the NAND strings NS arranged in the X direction.

[1-1-4] Threshold Distribution of Memory Cell Transistor

Figure 5:
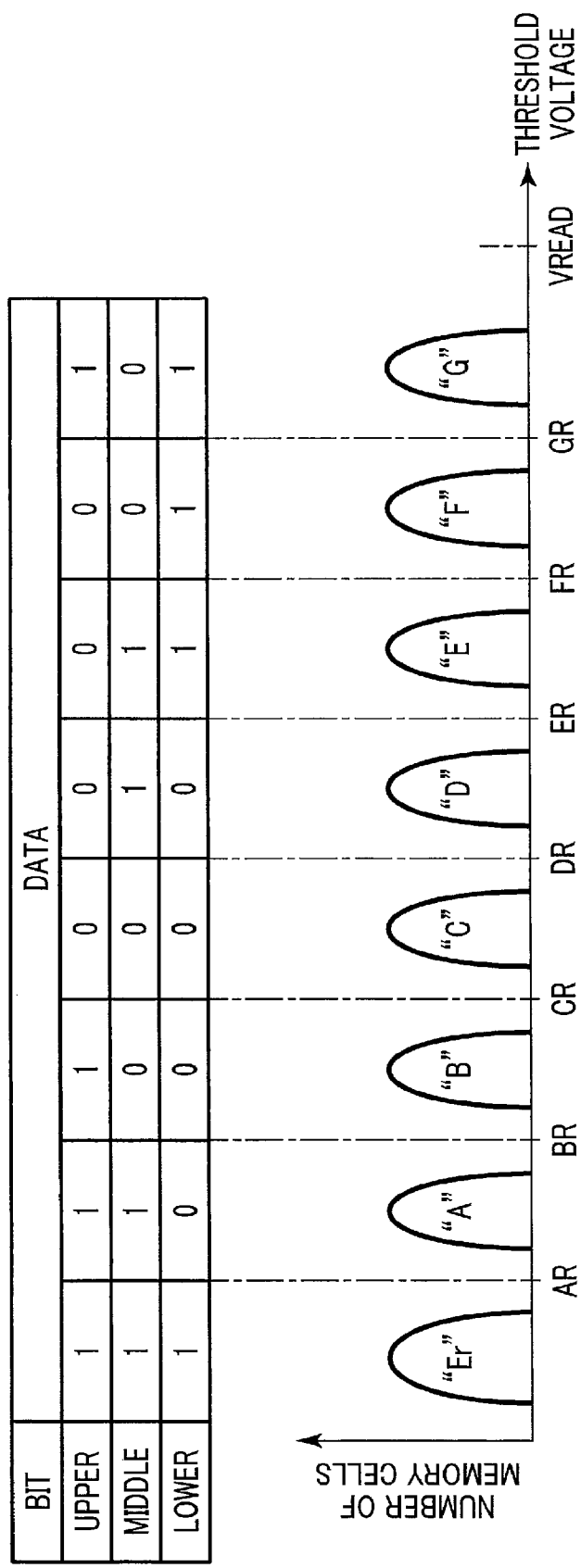
FIG. 5 is a schematic diagram illustrating an example of a threshold distribution of a memory cell transistor.

Next, a description will be given of distributions of a threshold voltage Vth of the memory cell transistor MT. FIG. 5 is a schematic diagram illustrating an example of a threshold distribution of the memory cell transistor MT. Each of the memory cell transistors MT can hold data of two or more bits. In the present embodiment, reference will be made to the case where the memory cell transistor MT holds 3-bit data, namely, so-called TLC (triple level cell) system.

The 3-bit data is defined by a lower, bit, a middle bit, and an upper bit. When the memory cell transistor MT stores three bits, the memory cell transistor MT can have one of eight states corresponding to a plurality of threshold voltages. The eight states will be referred to as states "Er", "A", "B", "C", "D", "E", "F", and "G" in order from the lowest state. The memory cell transistors MT belonging to the states "Er", "A", "B", "C", "D", "E", "F", and "G" form distributions.

For example, data "111", "110", "100", "000", "010", "011", "001", and "101" are assigned to the states "Er", "A", "B", "C", "D", "E", "F", and "G", respectively. When a lower bit is "X", a middle bit is "Y", and an upper bit is "Z", assignment of bits is "Z, Y, X". How data are assigned to the threshold distributions can be optionally determined.

In order to read the data stored in the memory cell transistor MT to be read, the state of the threshold voltage of the memory cell transistor MT is determined. For this state determination, read voltages AR, BR, CR, DR, ER, FR, and GR are used, and the read voltages AR, BR, CR, DR, ER, FR, and GR increase in this order.

The state "Er" corresponds to, for example, a state in which data is erased (erased state). The threshold voltage of the memory cell transistor MT belonging to the state "Er" is lower than the voltage AR and has a negative value, for example.

The states "A" to "G" correspond to a state in which charges are injected into the charge storage layer and data is written in the memory cell transistor MT. The threshold voltages of the memory cell transistors MT belonging to the states "A" to "G" have positive values, for example. The threshold voltage of the memory cell transistor MT belonging to the state "A" is higher than the read voltage AR and equal to or lower than the read voltage BR. The threshold voltage of the memory cell transistor MT belonging to the state "B" is higher than the read voltage BR and equal to or lower than the read voltage CR. The threshold voltage of the memory cell transistor MT belonging to the state "C" is higher than the read voltage CR and equal to or lower than the read voltage DR. The threshold voltage of the memory cell transistor MT belonging to the state "D" is higher than the read voltage DR and equal to or lower than the read voltage ER. The threshold voltage of the memory cell transistor MT belonging to the state "E" is higher than the read voltage ER and equal to or lower than the read voltage FR. The threshold voltage of the memory cell transistor MT belonging to the state "F" is higher than the read voltage FR and equal to or lower than the read voltage GR. The threshold voltage of the memory cell transistor MT belonging to the state "G" is higher than the read voltage GR and lower than a voltage VREAD.

The voltage VREAD is a voltage applied to the word line WL connected to the memory cell transistor MT of the cell unit CU which is not to be read. The voltage VREAD is higher than the threshold voltages of the memory cell transistors MT in any state. That is, the memory cell transistor MT whose control gate is applied with the voltage VREAD turns on without reference to the data it holds.

As described above, each of the memory cell transistors MT is set to any one of the eight states and can store 3-bit data. The write operation and the read operation are performed in units of pages of the cell unit CU. Where the memory cell transistor MT stores 3-bit data, a lower bit, a middle bit and an upper bit are assigned to the three pages of the cell unit CU. The pages that are collectively written or read using the lower bit, middle bit and upper bit will be referred to as a lower page, a middle page and an upper page, respectively.

[1-1-5] Configuration of Sense Amplifier Unit 28 and Data Register 29

FIG. 6 is a block diagram of the sense amplifier unit 28 and the data register 29 shown in FIG. 2.

The sense amplifier unit 28 comprises sense amplifier nits SAU0 to SAU(m−1) corresponding to the bit lines BL0 to BL(m−1), respectively. Each of the sense amplifier units SAU includes a sense amplifier SA and data latch circuits ADL, BDL, CDL, SDL, and TDL. The sense amplifier SA and the data latch circuits ADL, BDL, CDL, SDL, and TDL are connected together such that data can be transferred to and from each other.

The data latch circuits ADL, BDL, CDL, SDL, and TDL temporarily hold data. During the write operation, the sense amplifier SA controls the voltage of the bit line BL in accordance with the data held in the data latch circuit SDL. The data latch circuit TDL is used for data calculation in the sense amplifier unit 28. The data latch circuits ADL, BDL and CDL are employed for enabling multi-value actions in which the memory cell transistor MT holds data of two or more bits. That is, the data latch circuit ADL is used for holding a lower page. The data latch circuit BDL is used for holding a middle page. The data latch circuit CDL is used for holding an upper page. The number of data latch circuits provided for the sense amplifier unit SAU can be optionally determined in accordance with the number of bits held by the memory cell transistor MT.

At the time of the read operation, the sense amplifier SA senses data read to the corresponding bit line BL and determines whether the data is data "0" or data "1". At the time of the write operation, the sense amplifier SA applies a voltage to the bit line BL, based on the write data.

The data register 29 comprises data latch circuits XDL, the number of which corresponds to the number of sense amplifier units SAU0 to SAU(m−1). The data latch circuits XDL are connected to the input/output circuit 21. The data latch circuits XDL temporarily hold write data supplied from the input/output circuit 21, and temporarily hold read data supplied from the sense amplifier units SAU. To be more specific, the data transfer between the input/output circuit 21 and the sense amplifier units 28 is performed via the data latch circuits XDL corresponding to a page. Write data received by the input/output circuit 21 is transferred to one of the data latch circuits ADL, BDL and CDL via the data latch circuit XDL. Read data read by the sense amplifier SA is transferred to the input/output circuit 21 via the data latch circuit XDL.

(Specific Configuration Example of Sense Amplifier Unit SAU)

Figure 7:
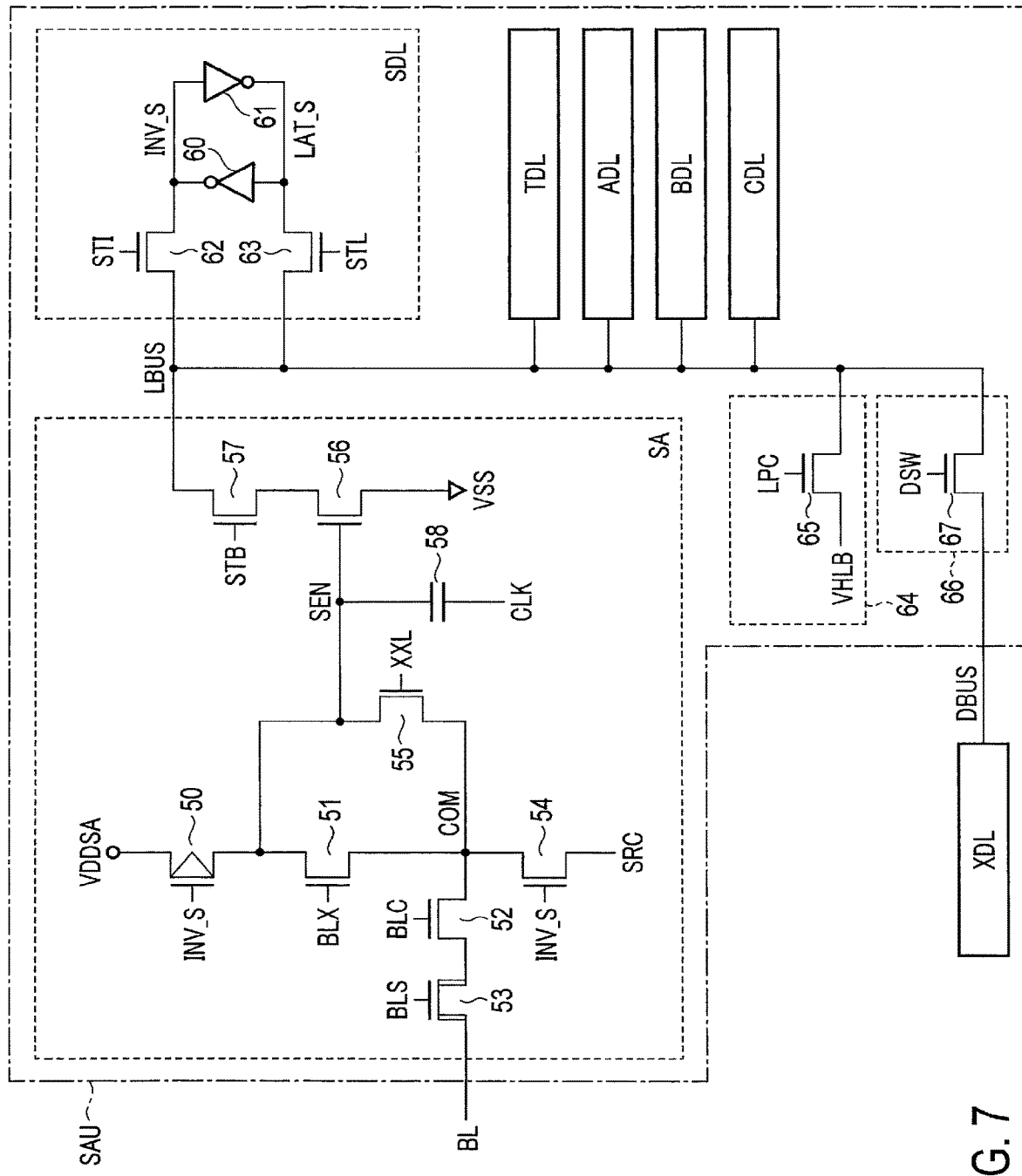
FIG. 7 is a circuit diagram of the sense amplifier unit.

Next, a specific configuration example of the sense amplifier unit SAU will be described. FIG. 7 is a circuit diagram of the sense amplifier unit SAU. A plurality of signals supplied to the sense amplifier unit SAU are generated by the sequencer 24.

The sense amplifier SA includes, for example, a p-channel MOS transistor 50, n-channel MOS transistors 51 to 57, and a capacitor 58.

The source of the transistor 50 is connected to a power supply terminal to which a power supply voltage VDDSA for the sense amplifier is supplied, the drain thereof is connected to a node SEN, and the gate thereof is connected to a node INV_S in the data latch circuit SDL. The drain of the transistor 51 is connected to the node SEN, and the source thereof is connected to a node COM. A signal BLX is input to the gate of the transistor 51.

The drain of the transistor 52 is connected to the node COM, and a signal BLC is input to the gate of the transistor 52. The drain of the transistor 53 is connected to the source of the transistor 52, and the source of the transistor 53 is connected to the corresponding bit line BL. A signal BLS is input to the gate of the transistor 53. The transistor 53 is a MOS transistor with high withstand voltage.

The drain of the transistor 54 is connected to the node COM, the source thereof is connected to a node SRC, and the gate thereof is connected to the node INV_S. For example, a ground voltage VSS is applied to the node SRC. The drain of the transistor 55 is connected to the node SEN, and the source thereof is connected to the node COM. A signal XXL is input to the gate of the transistor 55.

The source of the transistor 56 is connected to a ground terminal to which the ground voltage VSS is supplied, and the gate thereof is connected to the node SEN. The source of the transistor 57 is connected to the drain of the transistor 56, and the drain of the transistor 57 is connected to the bus LBUS. A signal STB is input to the gate of the transistor 57. The signal STB controls a timing of determining the data read out to the bit line BL.

One electrode of the capacitor 58 is connected to the node SEN, and a clock signal CLK is input to the other electrode of the capacitor 58.

The data latch circuit SDL includes inverters 60 and 61 and n-channel MOS transistors 62 and 63. An input terminal of the inverter 60 is connected to a node LAT_S, and an output terminal thereof is connected to the node INV_S. An input terminal of the inverter 61 is connected to the node INV_S, and an output terminal thereof is connected to the node LAT_S. One end of the transistor 62 is connected to the node INV_S, and the other end is connected to the bus LBUS. A signal ST1 is input to the gate of the transistor 62. One end of the transistor 63 is connected to the node LAT_S, and the other end is connected to the bus LBUS. A signal STL is input to the gate of the transistor 63. For example, data held in the node LAT_S corresponds to data held in the data latch circuit SDL, and data held in the node INV_S corresponds to inverted data of the data held in the node LAT_S. Since circuit configurations of the data latch circuits ADL, BDL, CDL, and TDL are the same as the circuit configuration of the data latch circuit SDL, the description thereof will be omitted.

The sense amplifier unit SAU further includes a precharge circuit 64 and a bus switch 66.

The precharge circuit 64 precharges the bus LBUS. The precharge circuit 64 includes, for example, an n-channel MOS transistor 65. The drain of the transistor 65 is connected to the bus LBUS. A precharge voltage VHLB is applied to the source of the transistor 65, and a signal LPC is input to the gate of the transistor 65. The precharge circuit 64 transfers the voltage VHLB to the bus LBUS to precharge the bus LBUS.

The bus switch 66 connects the bus LBUS and a bus DBUS. The bus LBUS is connected to the data latch circuit XDL included in the data register 29. The bus switch 66 includes, for example, an n-channel MOS transistor 67. One end of the transistor 67 is connected to the bus LBUS, and the other end is connected to the bus DBUS. A signal DSW is input to the gate of the transistor 67.

[1-2] Operation

The operation of the memory system 1 configured as described above will be described.

[1-2-1] Outline of Program Sequence

Upon receiving a program command, an address, and write data from the memory controller 3, the NAND flash memory 2 executes a program sequence.

FIG. 8 is a schematic diagram illustrating the program sequence. FIG. 8 shows extracted voltages applied to a selected word line (WL_sel).

The program sequence includes a plurality of program loops repeated in order. Each of the program loops includes a program operation and a verify operation.

The program operation is an operation of increasing the threshold voltage of the memory cell transistor MT by injecting charges (electrons) into the charge storage layer of the memory cell transistor MT or an operation of maintaining the threshold voltage of the memory cell transistor MT by inhibiting the injection of electrons into the charge storage layer. A program voltage VPGM is applied to the selected word line. The operation of increasing the threshold voltage is referred to as "0" write, and the operation of maintaining the threshold voltage is referred to as "1" write or write inhibit. To be more specific, the voltage applied to the bit line BL differs between the "0" write and the "1" write. For example, a ground voltage VSS is applied to the bit line BL corresponding to the "0" write. For example, a power supply voltage VDDSA (>VSS) is applied to the bit line BL corresponding to the "1" write.

The verify operation is an operation of reading the data in the memory cell transistor MT after the program operation and determining whether or not the threshold voltage of the memory cell transistor MT reaches the target level. A desired verify voltage (VFY in FIG. 8) is applied to the selected word line. The case where the threshold voltage of the memory cell transistor MT reaches the target level will be referred to as "verify pass", and the case where the threshold voltage does not reach the target level will be referred to as "verify fail." Details of the verify operation are the same as the read operation.

As shown in FIG. 8, the program voltage VPGM is set higher by a step-up voltage ΔVPGM each time the number of program loops increases. This makes it possible to sequentially shift the threshold voltage of the memory cell transistor MT.

Figure 9:
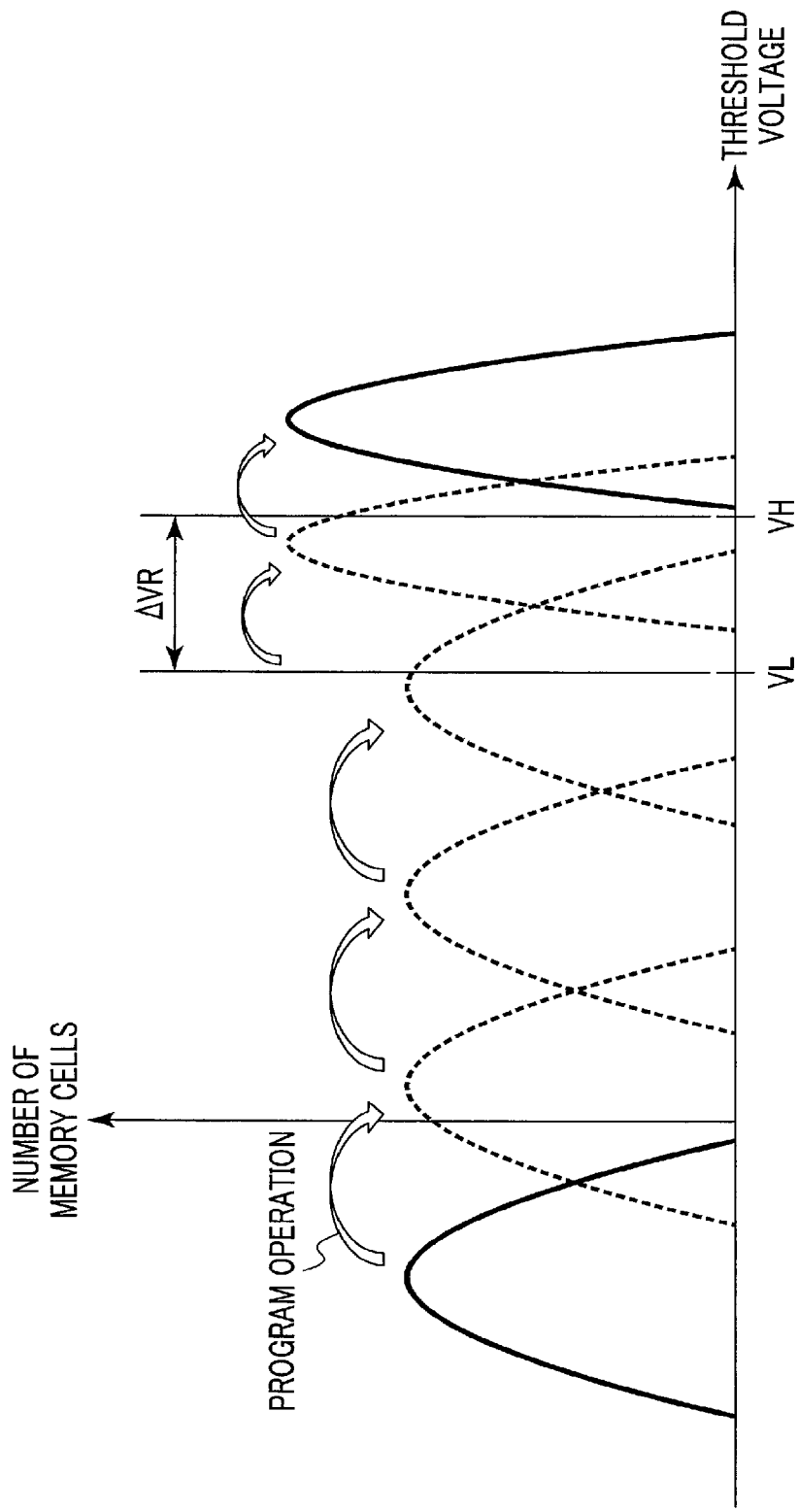
FIG. 9 is a schematic diagram illustrating a QPW method.

Next, a QPW (quick pass write) method will be described. FIG. 9 is a schematic diagram illustrating the QPW method.

In the QPW method, two types of verify voltages VH and VL are used in the verify operation. The verify voltages VH and VL are provided for each state of the memory cell transistor MT. The verify voltage VL is set lower than the verify voltage VH by a predetermined voltage ΔVR. The verify voltage VH corresponds to a final target threshold voltage of the memory cell transistor MT. The memory cell transistor MT for which the verification according to the verify voltage VH is passed is set to write inhibit in the subsequent program operation.

In the program operation by the QPW method, the voltage applied to the bit line BL to be programmed varies according to the verify result according to the verify voltages VH and VL. More specifically, when the threshold voltage of the memory cell transistor MT is less than the verify voltage VL, the sense amplifier unit 28 applies, for example, the ground voltage VSS to the corresponding bit line BL. When the threshold voltage of the memory cell transistor MT is equal to or higher than the verify voltage VL and less than the verify voltage VH, a QPW voltage VQPW is applied to the corresponding bit line BL. The voltage VQPW has a relationship of "VDDSA>VQPW>VSS".

In this state, when the program voltage VPGM is applied to the selected word line, as shown in FIG. 9, an increase amount of the threshold voltage in the memory cell transistor MT whose threshold voltage is equal to or higher than the verify voltage VL and less than the verify voltage VH is smaller than the increase amount of the threshold voltage in the memory cell transistor MT whose threshold voltage is less than the voltage VL.

Thus, in the program operation to which the QPW method is applied, since it is suppressed that the final target threshold voltage VH of the memory cell transistor MT is largely exceeded, the threshold distribution of the state where the program has completed can be narrowed.

[1-2-2] Program Operation

Figure 10:
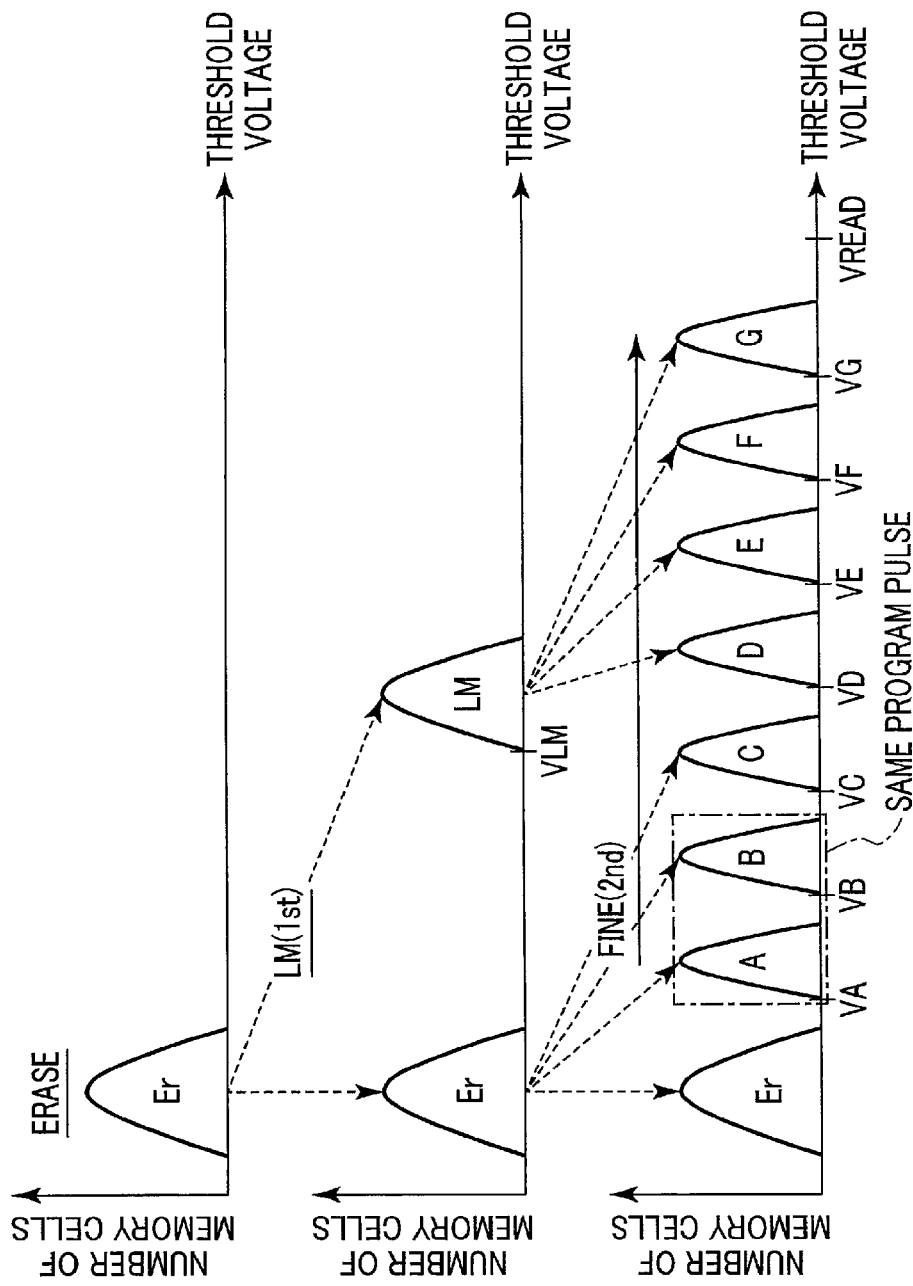
FIG. 10 is a diagram illustrating a program operation according to the first embodiment.

Next, the program operation will be described. FIG. 10 is a diagram illustrating the program operation according to the first embodiment. The memory cell transistor MT is set to a target threshold voltage by a program operation of two stages. The program operation of the first stage is referred to as an LM program, and the program operation of the second stage is referred to as a fine program.

First, the LM program is executed for the cell unit CU in the erased state. In the LM program, the memory cell transistor MT is programmed to the state "Er" or "LM". The memory cell transistor MT belonging to the state "LM" is set to be equal to or higher than a verify voltage VLM. The threshold voltage of the state "LM" is set to a threshold voltage equal to or higher than the state "A" and equal to or lower than the state "D".

After the LM program, the fine program is executed. In the fine program, the memory cell transistor MT to be programmed is programmed to one of the states "Er" to "G". Specifically, in the LM program, the memory cell transistor MT belonging to the state "Er" is programmed to one of the states "Er" to "C". In the LM program, the memory cell transistor MT belonging to the state "LM" is programmed to one of the states "D" to "G". The memory cell transistors MT belonging to the states "A" to "G" are each programmed using verify voltages VA to VG. How threshold voltages and data are assigned in a two-stage program (LM-Fine program) is set as follows, for example.

State "Er"=data "111"

State "A"=data "101"

State "B"=data "011"

State "C"=data "001"

State "D"=data "110"

State "E"=data "100"

State "F"=data "010"

State "G"=data "000"

In the LM program, since the threshold voltage of the memory cell transistor MT is set in two stages, threshold fluctuation during the fine program can be reduced. This makes it possible to reduce the threshold fluctuation caused by capacitive coupling of the charge storage layer in the adjacent memory cell transistor MT.

Here, in the present embodiment, the program of the state "A" and the program of the state "B" are executed in parallel using the same program voltage (program pulse). In addition, a period during which the ground voltage VSS is applied to the bit line connected to the memory cell transistor MT of the state "A" having a low threshold voltage is set to be shorter than a period during which the ground voltage VSS is applied to the bit line connected to the memory cell transistor MT of the state "B" having a high threshold voltage.

FIG. 11 is a timing chart illustrating the program operation according to the first embodiment. In the following description, a selected word line is referred to as "WL_sel". An unselected word line is referred to as "WL_usel". A write inhibit bit line is referred to as "BL(Inhibit)". A bit line programmed to the state "A" is referred to as "BL(Prog_A)". A bit line of the state "A" to be subjected to the QPW is referred to as "BL(QPW_A)". A bit line programmed to the state "B" is referred to as "BL(Prog_B)". A bit line of the state "B" to be subjected to the QPW is referred to as "BL(QPW_B)".

The NAND flash memory 2 receives a write command (including a program command, an address, and program data) from the memory controller 3. Thereafter, the sequencer 24 executes the program operation.

First, a bit line charging operation is performed. At time t0, the sense amplifier unit 28 applies the power supply voltage VDDSA to the bit line BL(Inhibit), the bit line BL(Prog_A), and the bit line BL(QPW_A), applies the ground voltage VSS to the bit line BL(Prog_B), and applies the voltage VQPW to the bit line BL(QPW_B). The row decoder 26 applies a voltage Vsgdh to the select gate line SGD and applies the ground voltage VSS to the select gate line SGS. The voltage Vsgdh is a voltage which turns on the select transistor ST1. A voltage VSRC is applied to the source line SL. The voltage VSRC satisfies "VSS≤VSRC≤VDDSA". As a result, the select transistor ST1 turns on, and the select transistor ST2 turns off.

As a result, in the NAND string connected to the write inhibit bit line and the bit line BL related to the state "A", the power supply voltage VDDSA is transferred to the channel. In the NAND string connected to the bit line BL(Prog_B), the ground voltage VSS is transferred to the channel. In the NAND string connected to the bit line BL(QPW_B), the voltage VQPW is transferred to the channel. Thereafter, the row decoder 26 applies a voltage Vsgd to the select gate line SGD. The voltage Vsgd is lower than the voltage Vsgdh, turns on the select transistor ST1 connected to the selected bit line (the bit line to which the ground voltage VSS and the voltage VQPW are applied), and cuts off the select transistor ST1 connected to the unselected bit line BL (the bit line BL to which the power supply voltage VDDSA is applied).

At time t1, the row decoder 26 applies the program voltage VPGM to the selected word line WL_sel and applies the voltage VPASS to the unselected word line WL_usel. The voltage VPASS is a voltage which turns on the memory cell transistor MT regardless of the threshold voltage of the memory cell transistor MT. The program voltage VPGM is higher than the voltage VPASS.

In the NAND string connected to the bit line BL(Prog_B), a potential difference between the selected word line and the channel becomes large, and electrons are injected into the charge storage layer of the memory cell transistor MT. In the NAND string connected to the bit line BL(QPW_B), the potential difference between the selected word line and the channel becomes somewhat smaller than that in the bit line BL(Prog_B), and the number of electrons injected into the charge storage layer of the memory cell transistor MT becomes smaller. In the NAND string connected to the write inhibit bit line and the bit line BL related to the state "A", since the potential of the channel is boosted, the potential difference between the selected word line and the channel does not become large, and the threshold voltage of the memory cell transistor MT is maintained. That is, at the time t1, program is not performed in the memory cell transistor MT programmed to the state "A" (that is, almost no electrons are injected into the charge storage layer).

At time t2, the sense amplifier unit 28 applies the ground voltage VSS to the bit line BL(Prog_A) and applies the voltage VQPW to the bit line BL(QPW_A). The timing at which the voltage of the bit line is changed is controlled using the timer 24A in the control circuit 24. As a result, the NAND string connected to the bit line BL(Prog_A), the ground voltage VSS is transferred to the channel. In the NAND string connected to the bit line BL(QPW_A), the voltage VQPW is transferred to the channel. As a result, the memory cell transistor MT of the state "A" is programmed.

The program operation in the memory cell transistors of the states "C" to "G", that is, the control of the bit lines is the same as the program operation of the state "B".

At time t3, the row decoder 26 applies the ground voltage VSS to all the word lines WL. A period from t1 to t3 is a period during which the program voltage VPGM is applied. At time t4, the bit line BL and the source line SL are reset. The select transistors ST1 and ST2 are turned off.

Subsequently, the verify operation is executed. At time t5, the row decoder 26 applies the verify voltage VA for the state "A" to the selected word line WL_sel. The sense amplifier unit 28 applies a voltage VBL (>VSS) to all the bit lines (including BL(Inhibit), BL(Prog_A), BL(QPW_A), BL(Prog_B), and BL(QPW_B)). The voltage VREAD is applied to the unselected word line WL_usel. The select transistors ST1 and ST2 are turned on. For example, the voltage VSRC lower than the voltage VBL and equal to or higher than the ground voltage VSS is applied to the source line SL. The sense amplifier unit 28 determines the potential of the bit line. As a result, the threshold voltage of the memory cell transistor MT programmed to the state "A" is verified.

At time t6, the row decoder 26 applies the verify voltage VB for the state "B" to the selected word line WL_sel. The sense amplifier unit 28 determines the potential of the bit line. As a result, the threshold voltage of the memory cell transistor MT programmed to the state "B" is verified.

In practice, two types of verify voltages VL and VH for QPW are used in each of the states "A" and "B". However, in FIG. 11, only the verify voltages VA and VB are illustrated for simplicity. Also, the verify operation of a state higher than the state "B" is appropriately performed.

At time t7, the word line, the bit line BL, and the source line SL are reset. The select transistors ST1 and ST2 are turned off. Thereafter, the program loop is repeated for the memory cell transistor MT in which the verify operation fails. The program voltage is set higher by the step-up voltage AVPGM each time the number of program loops increases.

[1-2-3] Another Program Operation

Figure 12:
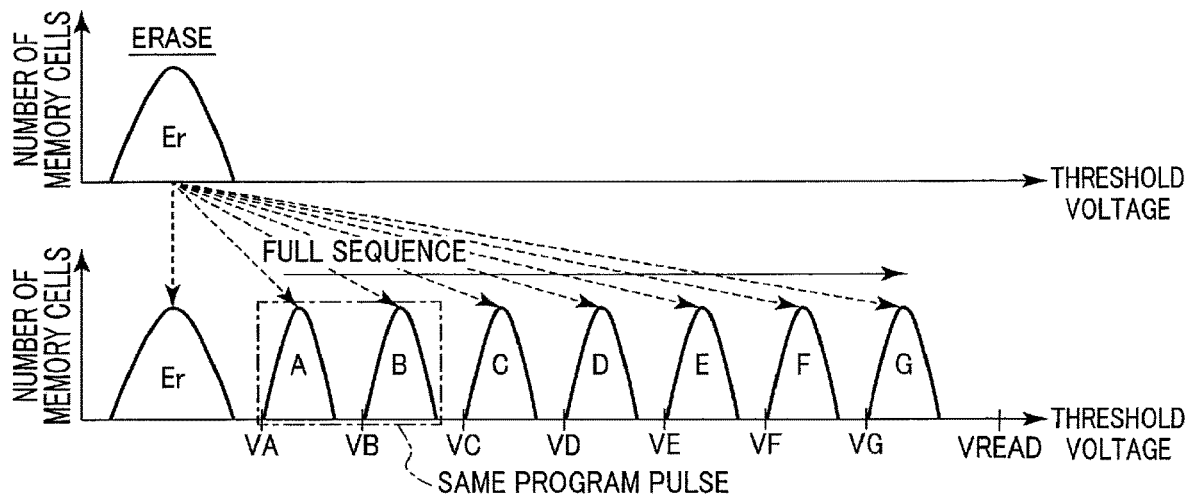
FIG. 12 is a diagram illustrating another program operation.

Next, another program operation will be described. FIG. 12 is a diagram illustrating another program operation. The memory cell transistor MT is set to a target threshold voltage by a program operation of one stage (full sequence program). How threshold voltages and data are assigned in the full sequence program is set as shown in FIG. 5, for example.

In the full sequence program, the states "A" to "G" are continuously programmed. Similarly to the above-described two-stage program (LM-Fine program), the program of the state "A" and the program of the state "B" are executed in parallel using the same program voltage. Details of the program operation in the states "A" and "B" are the same as those in FIG. 11.

[1-3] Effects of First Embodiment

As described in detail above, in the first embodiment, the NAND flash memory (semiconductor memory device) 2 includes the control circuit 24 which applies the program pulse to the word line and programs data in the memory cells. The control circuit 24 programs the first memory cell of the state "A" and the second memory cell of the state "B" in parallel using one time of the program pulse. In addition, in a period during which one time of the program pulse is applied, the control circuit 24 sets the timing at which the ground voltage VSS is applied to the first bit line connected to the first memory cell to be later than the timing at which the ground voltage VSS is applied to the second bit line connected to the second memory cell.

Thus, according to the first embodiment, the programs of the states "A" and "B" can be performed with the same program pulse. As a result, the number of program pulses can be reduced, which in turn makes it possible to shorten the time (program time) required for the program. As a result, it is possible to achieve the NAND flash memory 2 capable of improving writing performance.

After the programs of the states "A" and "B" are executed in parallel, the threshold voltage of the memory cell of the state "A" and the threshold voltage of the memory cell of the state "B" are determined by a verify operation. When the memory cell of the state "A" and the memory cell of the state "B" are programmed in separate program loops, it is necessary to execute the verify operation for each program loop. In this case, the time (verify time) required for the verification is increased by the number of times of the verify operation. In comparison with this, in the present embodiment, the verify time can be shortened.

Also in the QPW method, the timing at which the voltage VQPW is applied to the first bit line connected to the first memory cell is set to be later than the timing at which the voltage VQPW is applied to the second bit line connected to the second memory cell. As a result, when the programs of the states "A" and "B" are executed, the QPW method can be realized by using the same program pulse.

[2] Second Embodiment

In the second embodiment, in a program loop, a first program pulse for states "A" to "C" and a second program pulse for states "D" to "G" are successively applied to the selected word Line. In addition, programs of the states "A" and "B" are executed in parallel using the first program pulse, and programs of the states "D" and "E" are executed in parallel using the second program pulse.

Figure 13:
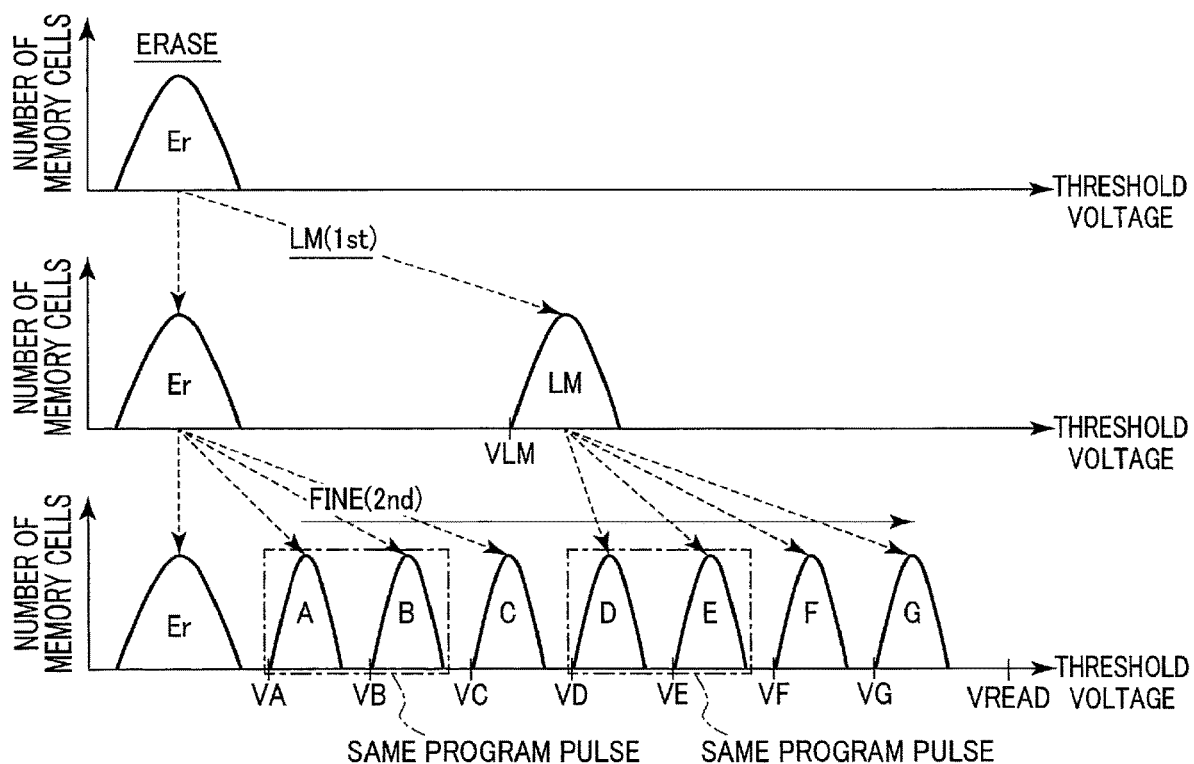
FIG. 13 is a diagram illustrating a program operation according to a second embodiment.

FIG. 13 is a diagram illustrating a program operation according to the second embodiment. First, an LM program of a first stage is executed.

Subsequently, a fine program of a second stage is executed. In the fine program, memory cell transistors MT programmed to the state "A" and the state "B" are programmed using the same program pulse. Further, in the fine program, the memory cell transistors MT programmed to the state "D" and the state "E" are programmed using the same program pulse.

Figure 14:
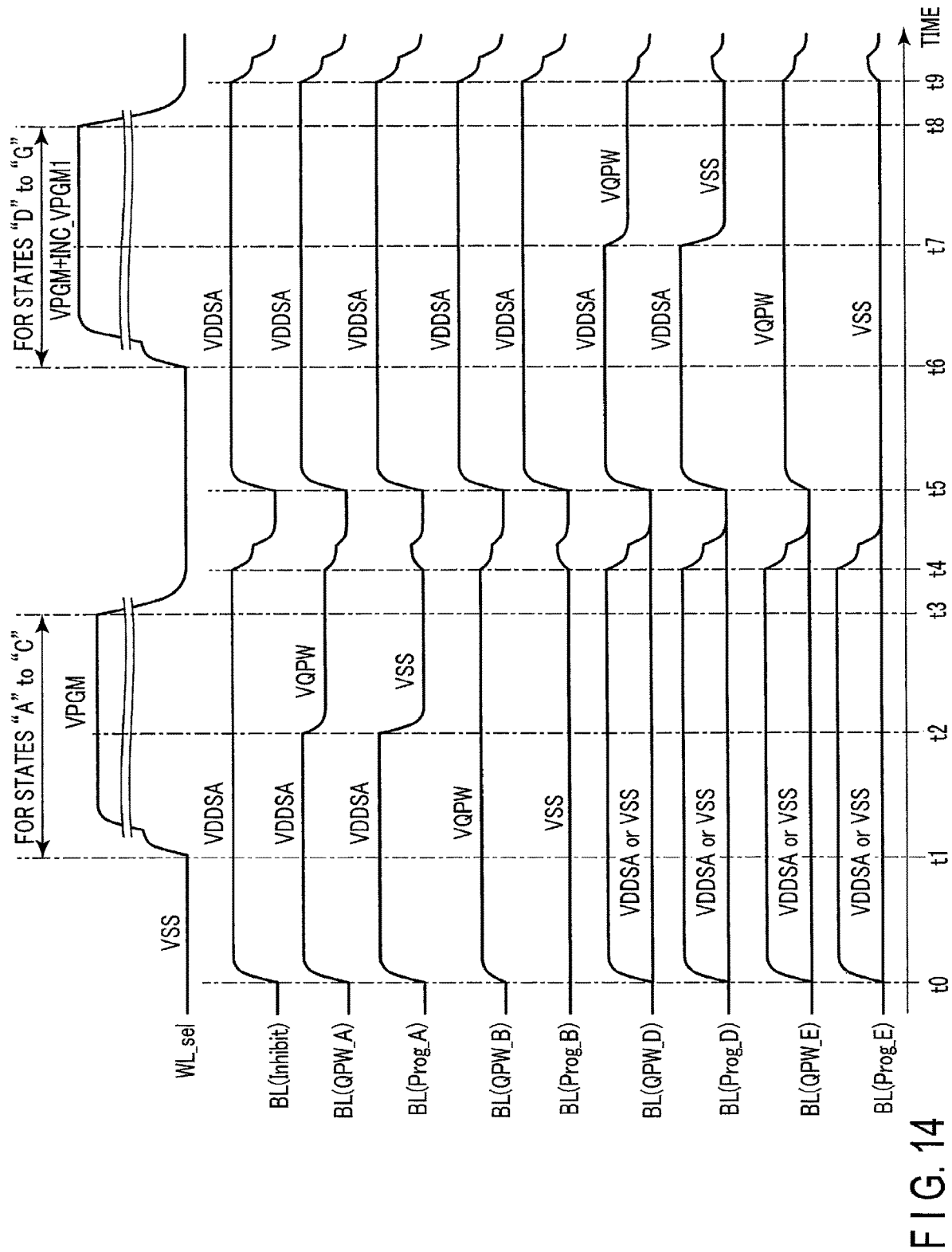
FIG. 14 is a timing chart illustrating the program operation according to the second embodiment.

FIG. 14 is a timing chart illustrating the program operation according to the second embodiment. FIG. 15 is a diagram illustrating a program sequence according to the second embodiment. A bit line programmed to the state "D" is referred to as "BL(Prog_D)". A bit line of the state "D" to be subjected to QPW is referred to as "BL(QPW_D)". A bit line programmed to the state "E" is referred to as "BL(Prog_E)". A bit line of the state "E" to be subjected to the QPW is referred to as "BL(QPW_E)".

At time t0 to t4, the programs of the states "A" to "C" are executed. The program operation in the memory cell transistors MT of the state "A" and the state "B" is the same as that of FIG. 11 described in the first embodiment. The program operation in the memory cell transistor of the state "C" is the same as the program operation of the state "B".

At time t0, the sense amplifier unit 28 applies a power supply voltage VDDSA or a ground voltage VSS to the bit line BL(Prog_D), the bit line BL(QPW_D), the bit line BL(Prog_E), and the bit line BL(QPW_E). The program operation in the memory cell transistors MT of the state "F" and the state "G" is the same as the program operation of the state "E". That is, the memory cell transistors MT of the states "D" to "G" may be "0" write or "1" write.

Subsequently, the programs of the states "D" to "G" are executed. At time t5, the sense amplifier unit 28 applies the power supply voltage VDDSA to the bit line BL(Inhibit), the bit line BL(Prog_D), and the bit line BL(QPW_D), applies the ground voltage VSS to the bit line BL(Prog_E), and applies the voltage VQPW to the bit line BL(QPW_E). The row decoder 26 applies a voltage Vsgdh to the select gate line SGD and applies the ground voltage VSS to the select gate line SGS. VSRC is applied to the source line SL. As a result, the select transistor ST1 turns on, and the select transistor ST2 turns off.

As a result, in a NAND string connected to a write inhibit bit line and the bit line BL related to the state "D", the power supply voltage VDDSA is transferred to the channel. In the NAND string connected to the bit line BL(Prog_E), the ground voltage VSS is transferred to the channel. In the NAND string connected to the bit line BL(QPW_E), the voltage VQPW is transferred to the channel. Thereafter, the row decoder 26 applies a voltage Vsgd to the select gate line SGD. The program operations in the memory cell transistors of the states "F" and "G" are the same as the program operation of the state "E". Bit lines related to the states "A" to "C" are set to the same voltage as the write inhibit bit line BL(Inhibit).

At time t6, the row decoder 26 applies a program voltage "VPGM+INC_VPGM1" to the selected word line WL_sel. The voltage VPGM is the same as the program voltage for the states "A" to "C". The voltage INC_VPGM1 is a voltage increased to the voltage VPGM and is a voltage for adjusting so that the program voltage "VPGM+INC_VPGM1" is optimized for the program of the state "E". The voltage INC_VPGM1 is optimally designed according to the characteristics of the memory cell transistor MT. The voltage control of an unselected word line WL_usel is the same as in the first embodiment. At this point, a program related to the state "E" is started.

At time t7, the sense amplifier unit 28 applies the ground voltage VSS to the bit line BL(Prog_D) and applies the voltage VQPW to the bit line BL(QPW_D). At this point, a program related to the state "D" is started.

At time t8, the row decoder 26 applies the ground voltage VSS to all the word lines WL. At time t9, the bit line BL and the source line SL are reset. The select transistors ST1 and ST2 are turned off.

Subsequently, as shown in FIG. 15, the verify operation is executed. In the verify operation, verify voltages VA, VB, VD, and VE are used. The verify operation is the same as in the first embodiment except for the number of verify voltages being different. In FIG. 15, a verify voltage VFY is shown in a simplified manner. Thereafter, the program loop is repeated for the memory cell transistor MT in which the verify operation fails. The program voltage is set higher by the step-up voltage ΔVPGM each time the number of program loops increases.

According to the second embodiment, the programs of the states "A" to "C" and the programs of the states "D" to "G" can be executed in a program loop. In addition, programs of the states "A" and "B" can be executed in parallel using the first program pulse, and programs of the states "D" and "E" can be executed in parallel using the second program pulse. As a result, the number of program pulses can be reduced, which in turn makes it possible to shorten the program time.

The threshold voltages of the memory cells of the states "A", "B", "D", and "E" are determined by a verify operation. As a result, the verify time can be shortened.

In FIGS. 13 and 14, the program operation of two stages is described as an example, but the present invention can also be applied to a full sequence program. FIG. 16 is a diagram illustrating a program operation according to a modification of the second embodiment. As in FIGS. 13 and 14, in a program loop, the first program pulse for the states "A" to "C" and the second program pulse for the states "D" to "G" are successively applied to the selected word Line.

[3] Third Embodiment

In the third embodiment, in a program loop, three kinds of program pulses are successively applied to a selected word line.

FIG. 17 is a diagram illustrating a program operation according to the third embodiment. In a program loop, three kinds of program pulses are sequentially applied to the selected word line. That is, programs of states "A" and "B" are executed in parallel using a first program pulse. Programs of states "C" and "D" are executed in parallel using a second program pulse. Programs of states "E" and "F" are executed in parallel using a third program pulse.

The voltage level increases in the order of the first program pulse, the second program pulse, and the third program pulse. The first program pulse is set to be optimal for the program of the state "B". The second program pulse is set to be optimal for the program of the state "D". The third program pulse is set to be optimal for the program of the state "F". The voltage control of a bit line corresponding to a state "G" is the same as the voltage control of a state "F".

According to the third embodiment, the programs of six states can be executed in a program loop.

In the third embodiment, the full sequence program is described as an example, but the third embodiment can also be applied to the two-stage program.

[4] Fourth Embodiment

In the fourth embodiment, three states are programmed in parallel using a program pulse.

FIG. 18 is a diagram illustrating a program operation according to the fourth embodiment. States "E" to "G" are programmed using the same program pulse.

Figure 19:
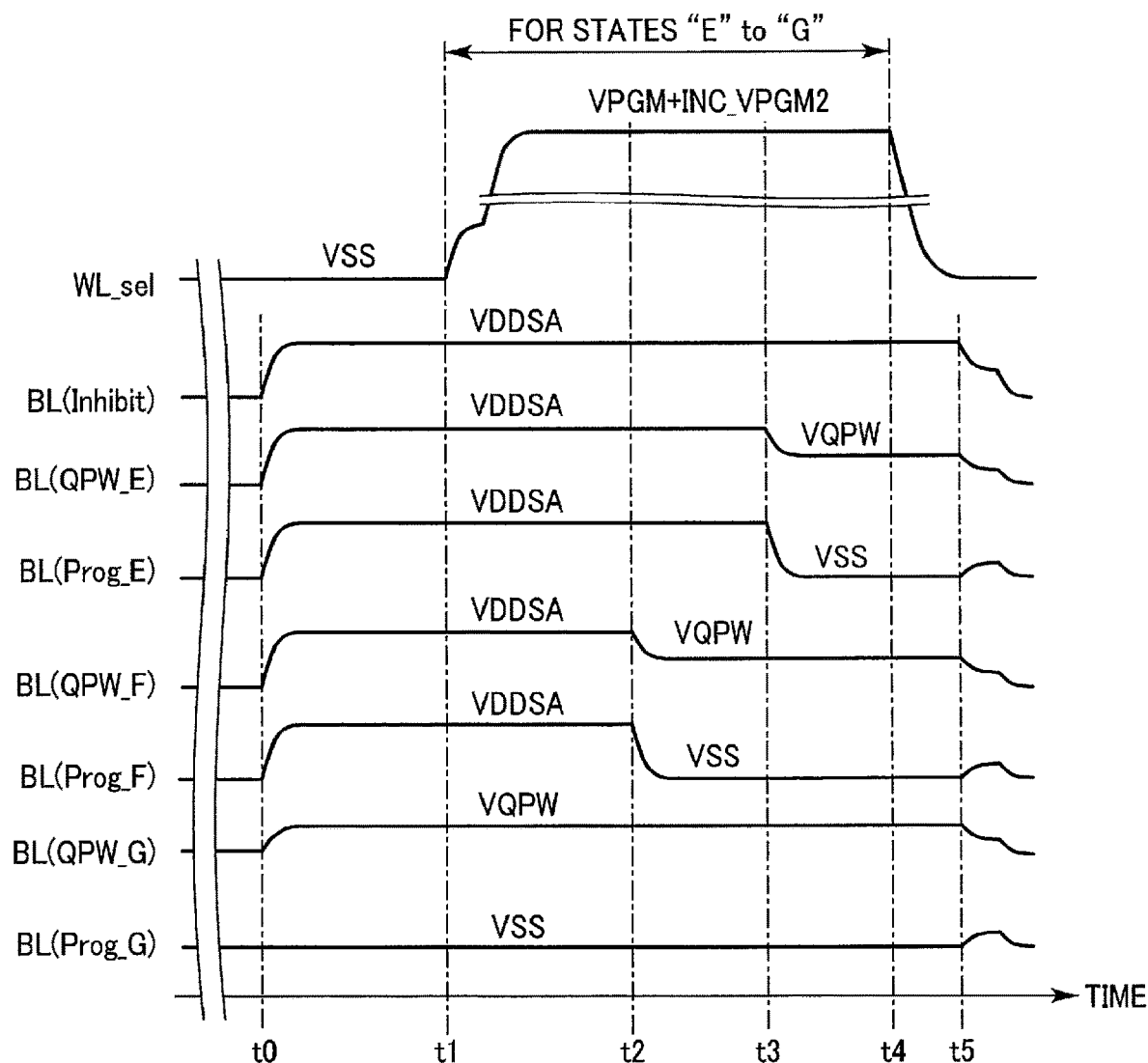
FIG. 19 is a timing chart illustrating the program operation according to the fourth embodiment.

FIG. 19 is a timing chart illustrating the program operation according to the fourth embodiment. A bit line programmed to the state "F" is referred to as "BL(Prog_F)". A bit line of the state "F" to be subjected to QPW is referred to as "BL(QPW_F)". A bit line programmed to the state "G" is referred to as "BL(Prog_G)". A bit line of the state "G" to be subjected to the QPW is referred to as "BL(QPW_G)".

First, programs of states "A" and "B" are executed in parallel, and subsequently programs of states "C" and "D" are executed in parallel. The operation of programming the two states using the same program pulse is as described above, and illustration thereof is omitted.

Subsequently, as shown in FIG. 19, the programs of the states "E" to "G" are executed. At time t0, the sense amplifier unit 28 applies a power supply voltage VDDSA to bit lines BL(Inhibit), BL(Prog_E), BL(QPW_E), BL(Prog_F), and BL(QPW_F), applies a ground voltage VSS to a bit line BL(Prog_G), and applies a voltage VQPW to a bit line BL(QPW_G). The row decoder 26 applies a voltage Vsgdh to the select gate line SGD and applies the ground voltage VSS to the select gate line SGS. VSRC is applied to the source line SL. As a result, the select transistor ST1 turns on, and the select transistor ST2 turns off. Bit lines related to the states "A" to "D" are set to the same voltage as the write inhibit bit line BL(Inhibit).

At time t1, the row decoder 26 applies a program voltage "VPGM+INC_VPGM2" to a selected word line WL_sel. The voltage VPGM is the same as the program voltage for the state "B". The voltage INC_VPGM2 is a voltage increased to the voltage VPGM and is a voltage for adjusting so that the program voltage "VPGM+INC_VPGM2" is optimized for the program of the state "G". The voltage INC_VPGM2 is optimally designed according to the characteristics of a memory cell transistor MT. The voltage control of an unselected word line WL_usel is the same as in the first embodiment. At this point, a program related to the state "G" is started.

At time t2, the sense amplifier unit 28 applies the ground voltage VSS to the bit line BL(Prog_F) and applies the voltage VQPW to the bit line BL(QPW_F). At this point, a program related to the state "F" is started.

At time t3, the sense amplifier unit 28 applies the ground voltage VSS to the bit line BL(Prog_E) and applies the voltage VQPW to the bit line BL(QPW_E). At this point, a program related to the state "E" is started.

At time t4, the row decoder 26 applies the ground voltage VSS to all the word lines WL. At time t5, the bit line BL and a source line SL are reset. The select transistors ST1 and ST2 are turned off.

Subsequently, the verify operation is executed. In the verify operation, verify voltages VA to VG are used. Thereafter, the program loop is repeated for the memory cell transistor MT in which the verify operation fails. The program voltage is set higher by the step-up voltage ΔVPGM each time the number of program loops increases.

According to the fourth embodiment, three states (states "E", "F", and "G" in the example of FIG. 19) can be programmed in parallel using a program pulse.

In the fourth embodiment, the full sequence program is described as an example, but the fourth embodiment can also be applied to the two-stage program.

[5] Modification

In connection with the embodiments described above, reference was made to the case where a memory cell transistor holds 3-bit data, but this is not restrictive. The above embodiment may be applied to a 2-bit/cell method in which a memory cell can store 2-bit data. Further, the above embodiment may be applied to a 4-bit/cell method in which a memory cell can store 4-bit data. Furthermore, the above embodiment may be applied to a storage method in which a memory cell can store data of five or more bits.

The type of state programmed using two kinds of program pulses can be optionally determined. Similarly, the type of state programmed using three kinds of program pulses can be optionally determined. Four or more states may be programmed using a program pulse.

In the above embodiment, a plurality of program pulses included in a program loop become higher as approaching the subsequent stage. For example, assuming that a program pulse for the first time is a first program pulse and a program pulse for the second time is a second program pulse, a relation of "first program pulse<second program pulse" is satisfied. However, the present invention is not limited thereto, and a plurality of program pulses may become lower as approaching the subsequent stage.

The "connection" in this specification means electrical connection and does not exclude the fact that another element is interposed between two connected elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a memory cell array comprising a plurality of memory cells, each of the memory cells being programmable to any one of a plurality of states;
a plurality of bit lines respectively connected to the memory cells;
a word line commonly connected to the memory cells; and
a control circuit which applies a program pulse to the word line and programs data in the memory cells,
wherein the control circuit programs a first memory cell of a first state and a second memory cell of a second state higher than the first state by using a first program pulse,
applies a first voltage to a first bit line connected to the first memory cell, and applies a second voltage lower than the first voltage to a second bit line connected to the second memory cell at a first time within a first period during which the first program pulse is applied,
applies the second voltage to the first and second bit lines at a second time within the first period and after the first time, and
the control circuit applies the first program pulse and then executes a verify operation in which the states of the first and second memory cells are verified, in the verify operation, the control circuit sequentially applies a first verify voltage for the first state and a second verify voltage for the second state to the word line.
2. The device according to claim 1, wherein the second voltage is a ground voltage.

3. The device according to claim 1, wherein the second voltage is higher than a ground voltage and lower than the first voltage.

4. The device according to claim 1, wherein the memory cell has a charge storage layer.

5. A semiconductor memory device comprising:
a memory cell array comprising a plurality of memory cells, each of the memory cells being programmable to any one of a plurality of states;
a plurality of bit lines respectively connected to the memory cells;
a word line commonly connected to the memory cells; and
a control circuit which applies a program pulse to the word line and programs data in the memory cells,
wherein the control circuit applies a first program pulse and a second program pulse higher than the first program pulse to the word line,
programs a first memory cell of a first state and a second memory cell of a second state higher than the first state by using the first program pulse, and
programs a third memory cell of a third state higher than the second state and a fourth memory cell of a fourth state higher than the third state by using the second program pulse.

6. The device according to claim 5, wherein
the bit lines include a first bit line connected to the first memory cell, a second bit line connected to the second memory cell, a third bit line connected to the third memory cell, and a fourth bit line connected to the fourth memory cell, and
the control circuit
applies a first voltage to the first bit line, applies a second voltage lower than the first voltage to the second bit line, and applies the first voltage or the second voltage to the third and fourth bit lines at a first time within a first period during which the first program pulse is applied,
applies the second voltage to the first and second bit lines, and applies the first voltage or the second voltage to the third and fourth bit lines at a second time within the first period and after the first time,
applies the first voltage to the first to third bit lines, and applies the second voltage to the fourth bit line at a third time within a second period during which the second program pulse is applied, and
applies the first voltage to the first and second bit lines, and applies the second voltage to the third and fourth bit lines at a fourth time within the second period and after the third time.

7. The device according to claim 5, wherein the second program pulse is applied to the word line in succession to the first program pulse.

8. The device according to claim 5, wherein the control circuit applies the first and second program pulses and then executes a verify operation in which the states of the first to fourth memory cells are verified.

9. The device according to claim 8, wherein in the verify operation, the control circuit sequentially applies a first verify voltage for the first state, a second verify voltage for the second state, a third verify voltage for the third state, and a fourth verify voltage for the fourth state to the word line.

10. The device according to claim 5, wherein the second voltage is a ground voltage.

11. The device according to claim 5, wherein the second voltage is higher than a ground voltage and lower than the first voltage.

12. The device according to claim 5, wherein the memory cell has a charge storage layer.

13. A semiconductor memory device comprising:
a memory cell array comprising a plurality of memory cells, each of the memory cells being prommmable to any one of a plurality of states;
a plurality of bit lines respectively connected to the memory cells;
a word line commonly connected to the memory cells; and
a control circuit which applies a program pulse to the word line and programs data in the memory cells,
wherein the control circuit:
programs a first memory cell of a first state and a second memory cell of a second state higher than the first state by using a first program pulse,
applies a first voltage to a first bit line connected to the first memory cell, and applies a second voltage lower than the first voltage and higher than a ground voltage to a second bit line connected to the second memory cell at a first time within a first period during which the first program pulse is applied, and
applies the second voltage to the first and second bit lines at a second time within the first period and after the first time.

14. The device according to claim 13, wherein the second voltage is equal to the ground voltage.

15. The device according to claim 13, wherein the memory cell has a charge storage layer.

16. The device according to claim 14, wherein the control circuit applies the first program pulse and then executes a verify operation in which the states of the first and second memory cells are verified,
in the verify operation, the control circuit sequentially applies a first verify voltage for the first state and a second verify voltage for the second state to the word line, and
the memory cell has a charge storage layer.

* * * * *